US008072765B2

(12) United States Patent
Yumoto et al.

(10) Patent No.: US 8,072,765 B2
(45) Date of Patent: *Dec. 6, 2011

(54) ELECTRO-OPTICAL APPARATUS, FLEXIBLE PRINTED CIRCUIT BOARD, MANUFACTURING METHOD FOR ELECTRO-OPTICAL APPARATUS, AND ELECTRONIC EQUIPMENT

(75) Inventors: Masanori Yumoto, Matsumoto (JP); Yoshihisa Hirano, Matsumoto (JP); Chiaki Imaeda, Nagano-Ken (JP)

(73) Assignee: Seiko Epson Corporation (JP)

( * ) Notice: Subject to any disclaimer, the term of this patent is extended or adjusted under 35 U.S.C. 154(b) by 552 days.

This patent is subject to a terminal disclaimer.

(21) Appl. No.: 10/944,674

(22) Filed: Sep. 17, 2004

(65) Prior Publication Data

US 2005/0088830 A1 Apr. 28, 2005

(30) Foreign Application Priority Data

Sep. 19, 2003 (JP) ................................. 2003-327992
Jun. 21, 2004 (JP) ................................. 2004-182455

(51) Int. Cl.
*H05K 1/00* (2006.01)
(52) U.S. Cl. .......................... 361/749; 361/810; 361/807
(58) Field of Classification Search .................. 361/803, 361/804, 784, 720, 748–749, 759–760, 807, 361/810; 349/58, 150; 174/200, 254–258; 439/39, 150, 67; 343/700, 709, 893
See application file for complete search history.

(56) References Cited

U.S. PATENT DOCUMENTS

| | | | | | |
|---|---|---|---|---|---|
| 5,224,023 A | * | 6/1993 | Smith et al. | .................. | 361/784 |
| 5,838,412 A | * | 11/1998 | Ueda et al. | .................. | 349/150 |
| 6,191,838 B1 | * | 2/2001 | Muramatsu | .................... | 349/149 |
| 6,320,750 B2 | * | 11/2001 | Shaler et al. | .................. | 361/736 |
| 6,519,021 B1 | | 2/2003 | Aruga | | |
| 6,613,599 B2 | * | 9/2003 | Imaeda | .......................... | 438/30 |
| 6,814,582 B2 | * | 11/2004 | Vadasz et al. | .................... | 439/61 |
| 6,972,966 B1 | * | 12/2005 | Oishi et al. | ..................... | 361/803 |
| 2002/0149074 A1 | * | 10/2002 | Imaeda | ........................ | 257/432 |
| 2003/0197813 A1 | * | 10/2003 | Nakanishi et al. | .............. | 349/12 |
| 2005/0063168 A1 | * | 3/2005 | Miyasaka | ....................... | 362/26 |
| 2005/0094052 A1 | * | 5/2005 | Sakurai et al. | ................... | 349/58 |
| 2006/0152647 A1 | * | 7/2006 | Han et al. | ........................ | 349/58 |

FOREIGN PATENT DOCUMENTS

| | | |
|---|---|---|
| JP | 09-318965 | 12/1997 |
| JP | 2000-195902 | 7/2000 |
| JP | 2000-275673 | 10/2000 |

(Continued)

OTHER PUBLICATIONS

Nielsen et al (Naunyn-Schmiedeberg's Archives of Pharmacology, vol. 300, Summary; 1977).*
NIH Publication No. 05-4642 [online], www.diabetes.niddk.nih.gov, Jan. 2005 [retrieved on Nov. 6, 2011]. Retrieved from the Internet: <URL: http://diabetes.niddk.nih.gov/dm/pubs/diagnosis/.*

(Continued)

*Primary Examiner* — Hung S Bui
(74) *Attorney, Agent, or Firm* — Harness, Dickey & Pierce, P.L.C.

(57) ABSTRACT

A liquid crystal display device includes a liquid crystal display panel having a first substrate and a second substrate opposed thereto arranged so that the inner surfaces thereof oppose each other with an intermediate sealing member and a liquid crystal interposed in the internal space, and a flexible printed circuit board having an input/output terminals connected thereto. A circuit board on which a plurality of electronic components required for operating the liquid crystal display apparatus are mounted on the flexible printed circuit board.

8 Claims, 17 Drawing Sheets

FOREIGN PATENT DOCUMENTS

| | | |
|---|---|---|
| JP | 2001-125078 | 5/2001 |
| JP | 2001-156418 | 6/2001 |
| JP | 2001-249353 | 9/2001 |
| JP | 2001-358422 | 12/2001 |
| JP | 2002-299773 | 10/2002 |
| JP | 2004-087939 | 3/2004 |
| KR | 10-2001-0039881 | 5/2001 |
| TW | 504042 | 9/2002 |

OTHER PUBLICATIONS

Communication from Taiwan Patent Office regarding related application.

Communication from Korean Patent Office re: related application.

Communication from Chinese Patent regarding counterpart application.

* cited by examiner

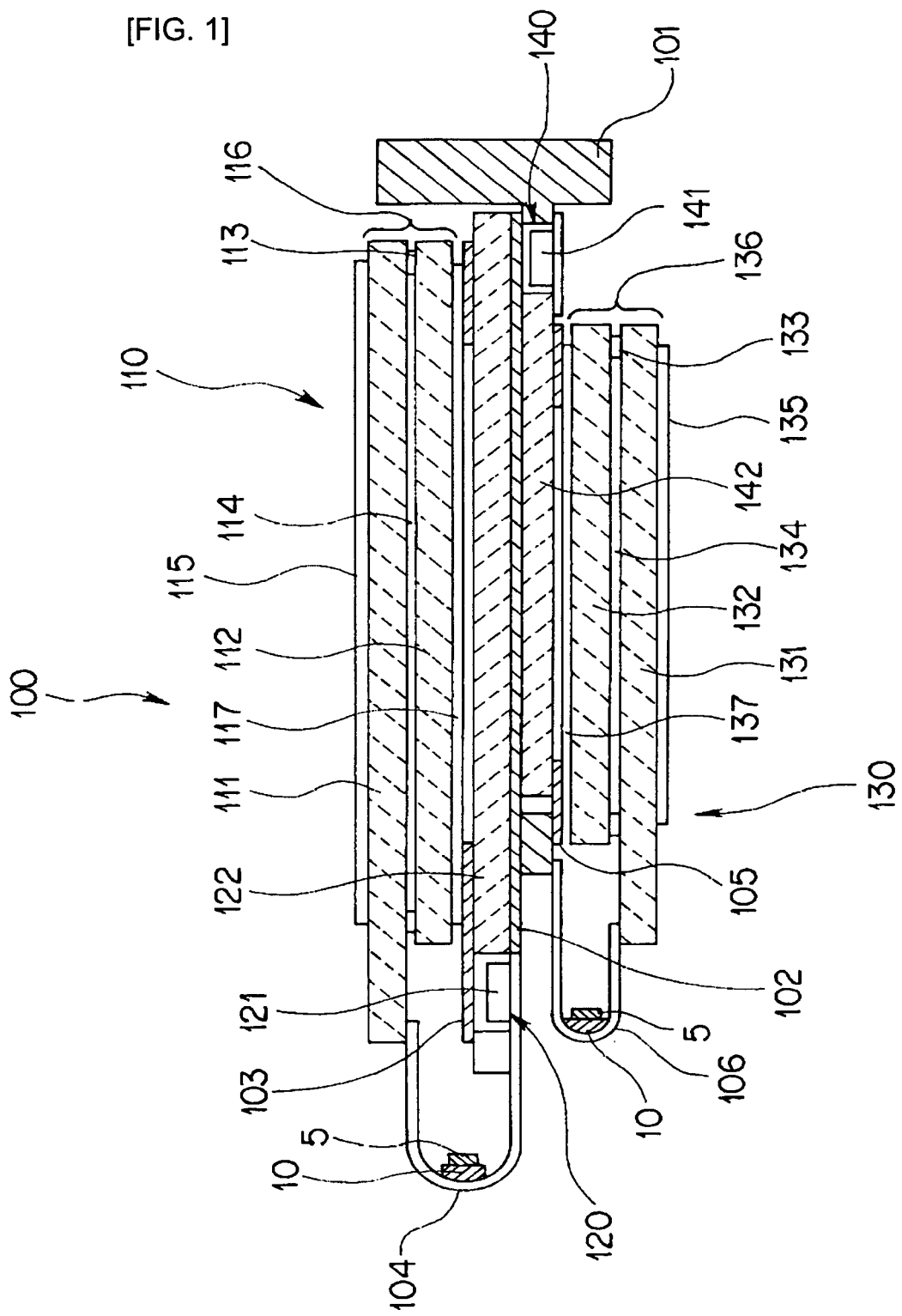
[FIG. 1]

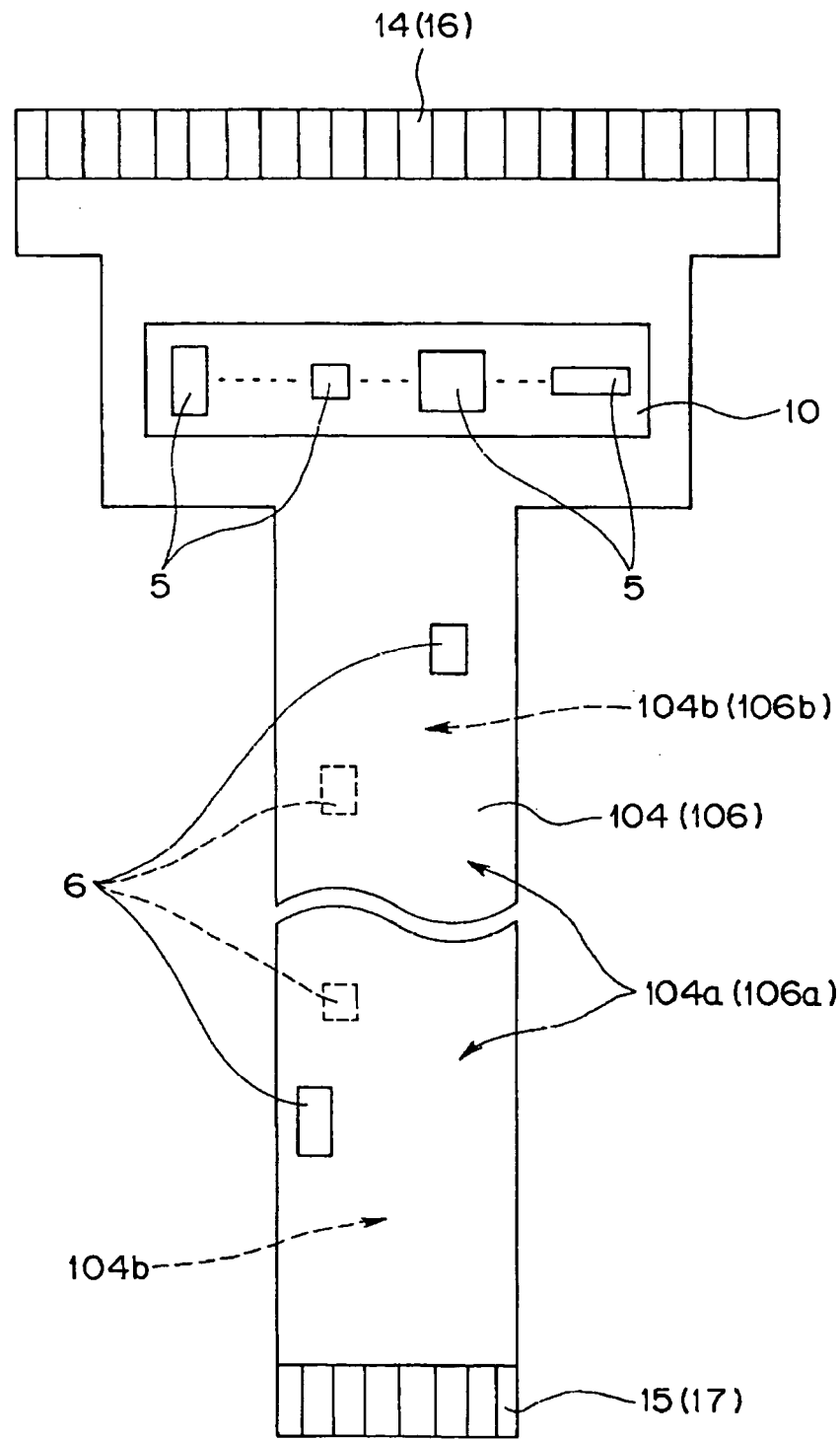
[FIG. 2]

[FIG. 3]
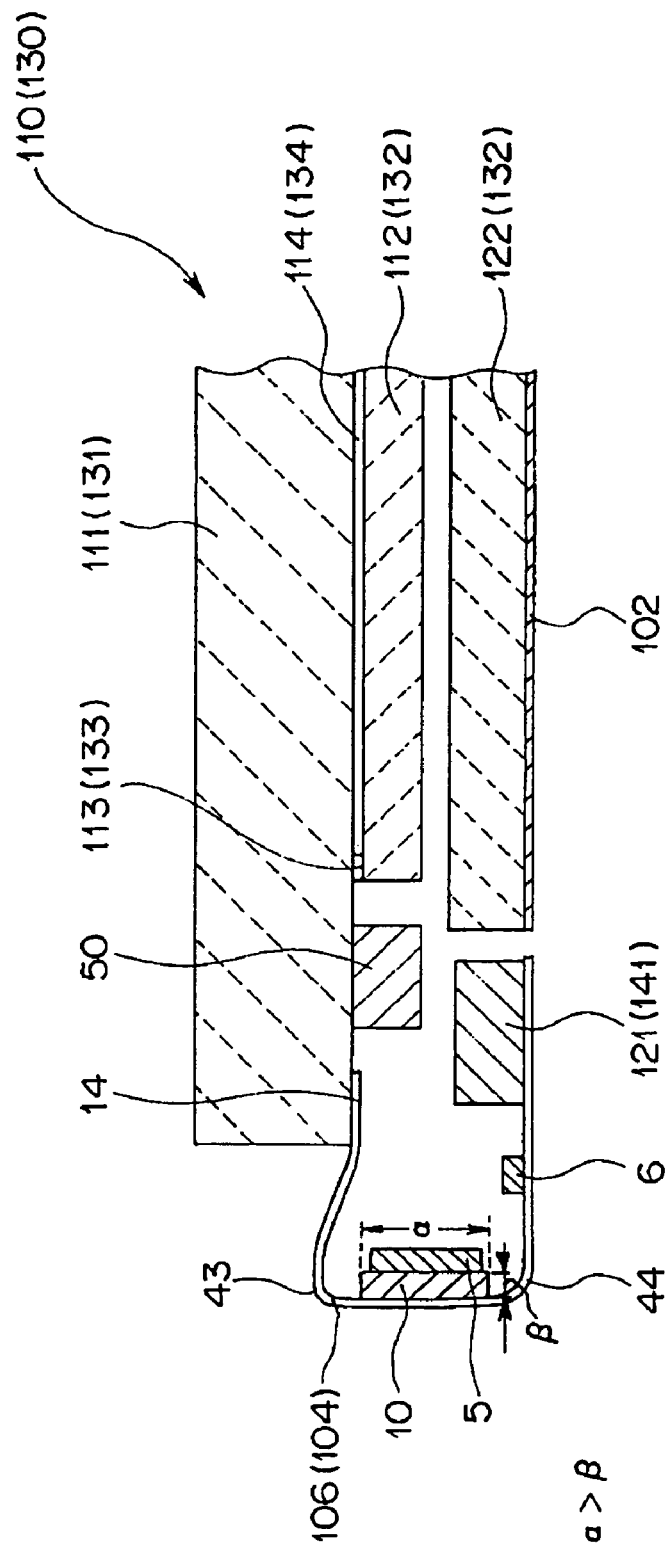

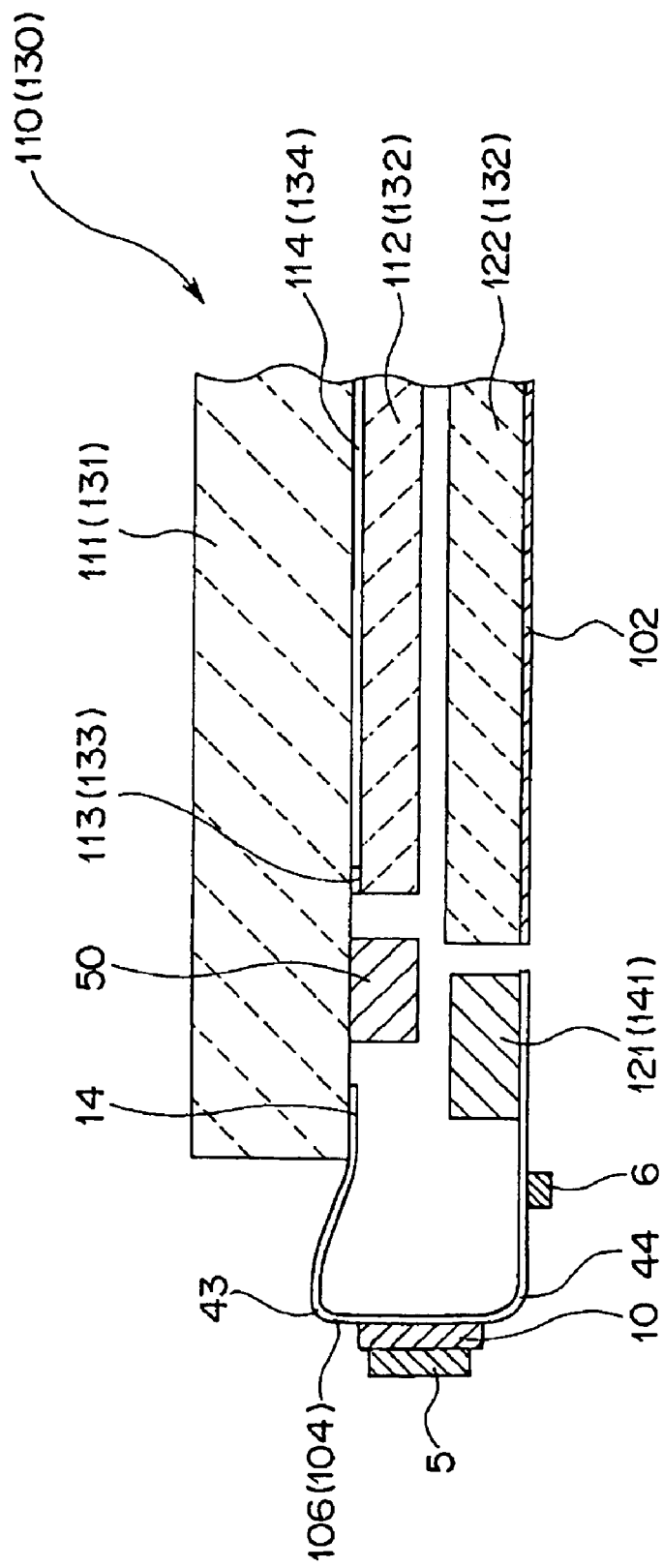
[FIG. 4]

[FIG. 5]
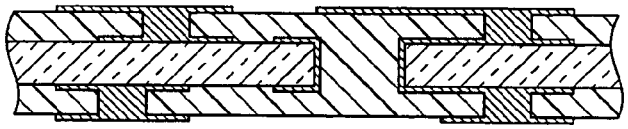

[FIG. 6]
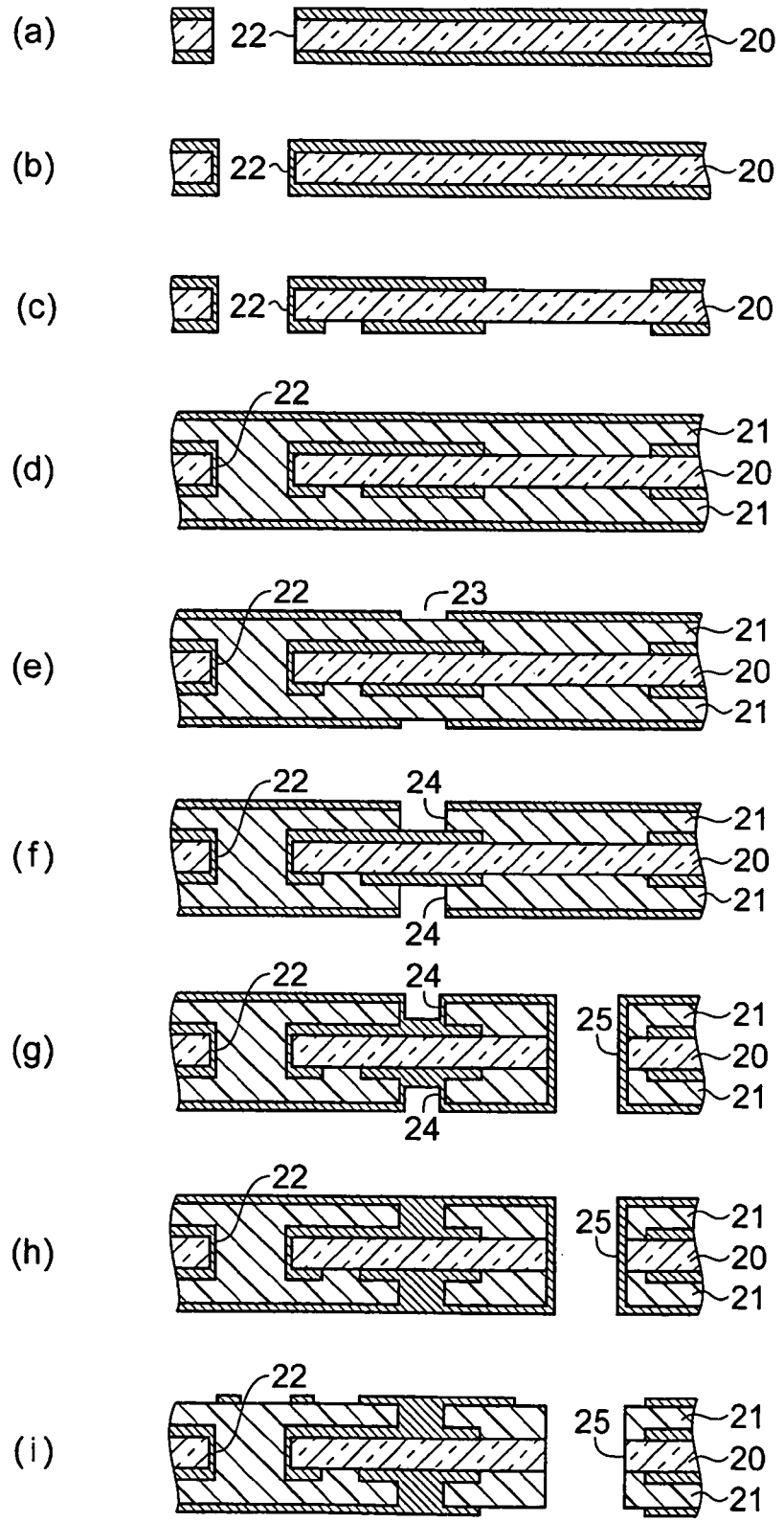

[FIG. 7]
(a) 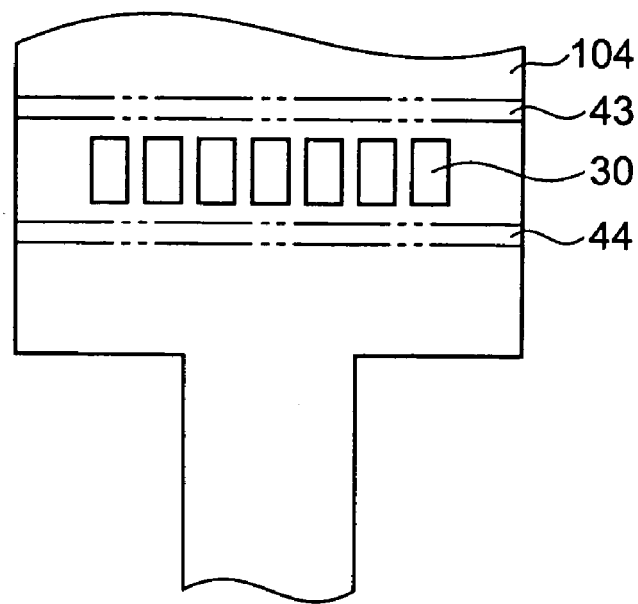
(b) 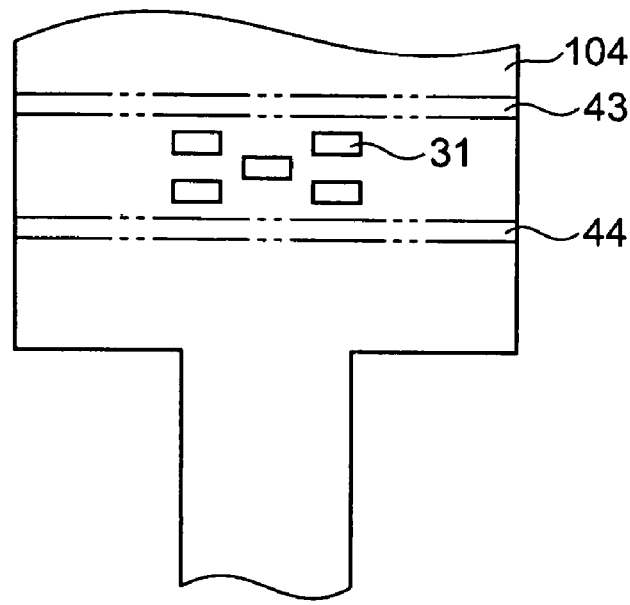

[FIG. 8]
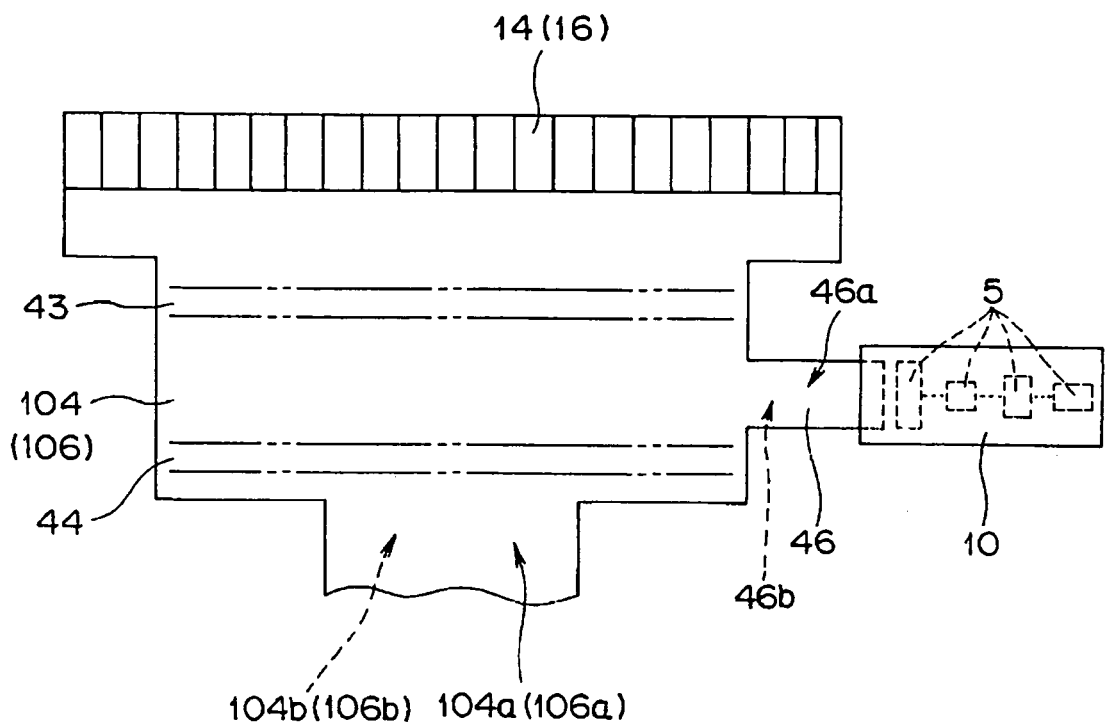
[FIG. 9]
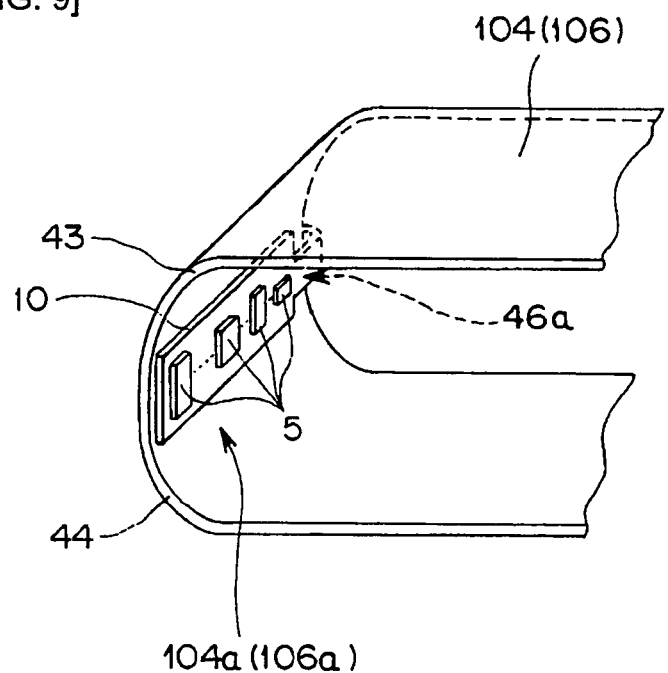

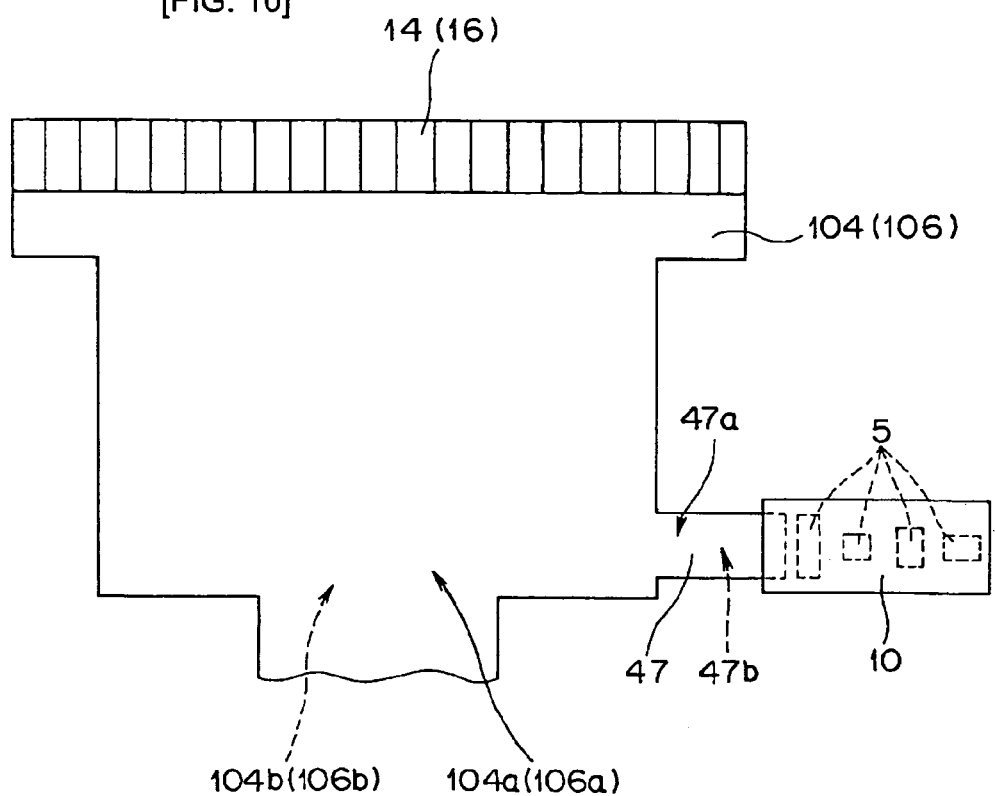
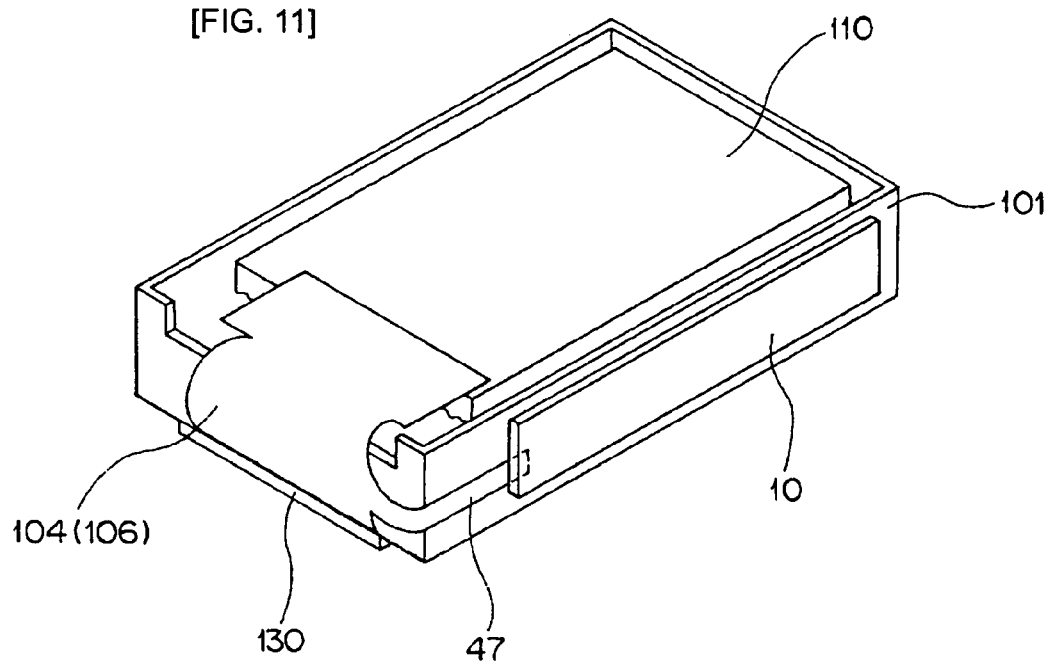

[FIG. 12]
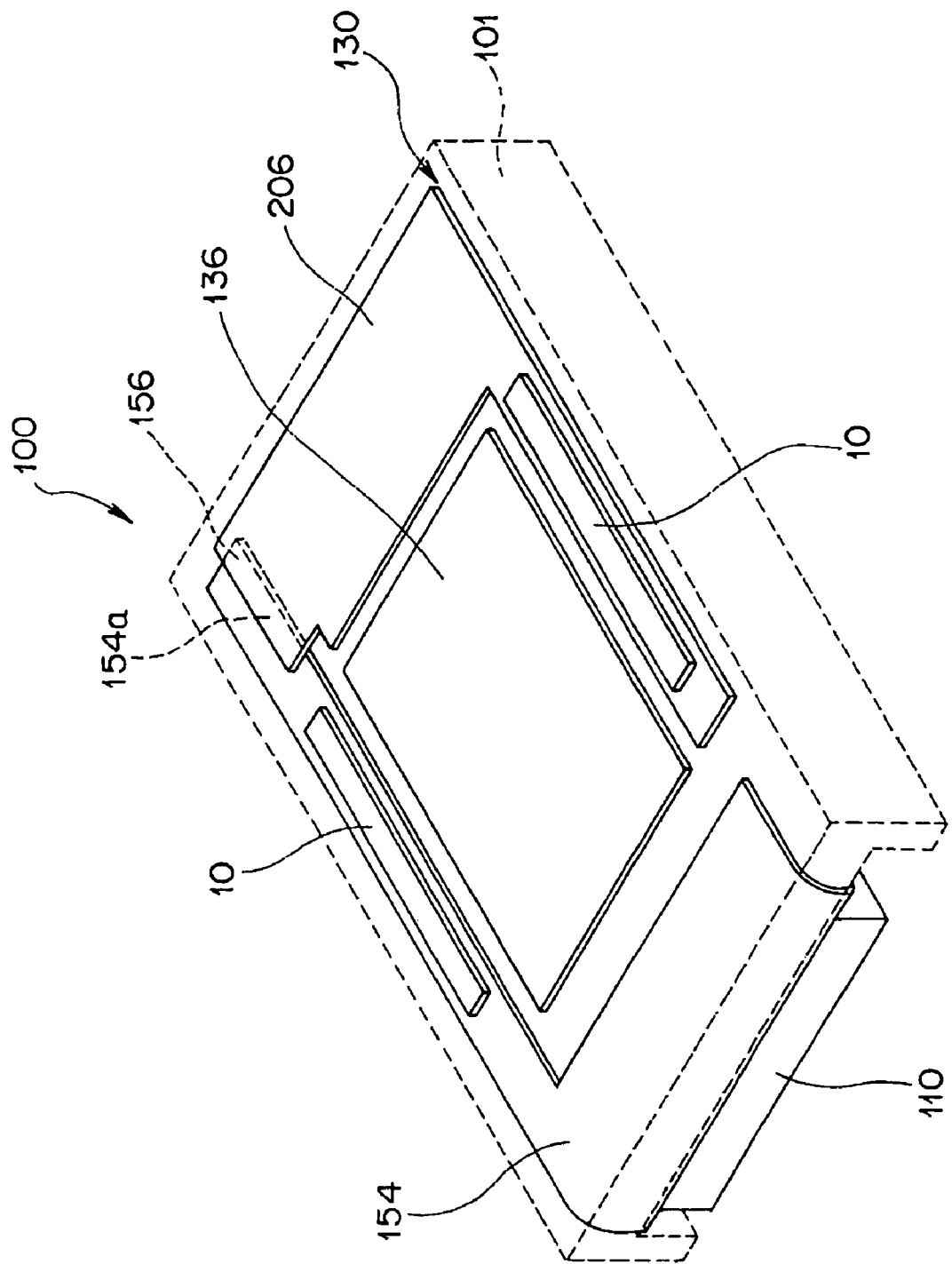

[FIG. 13]
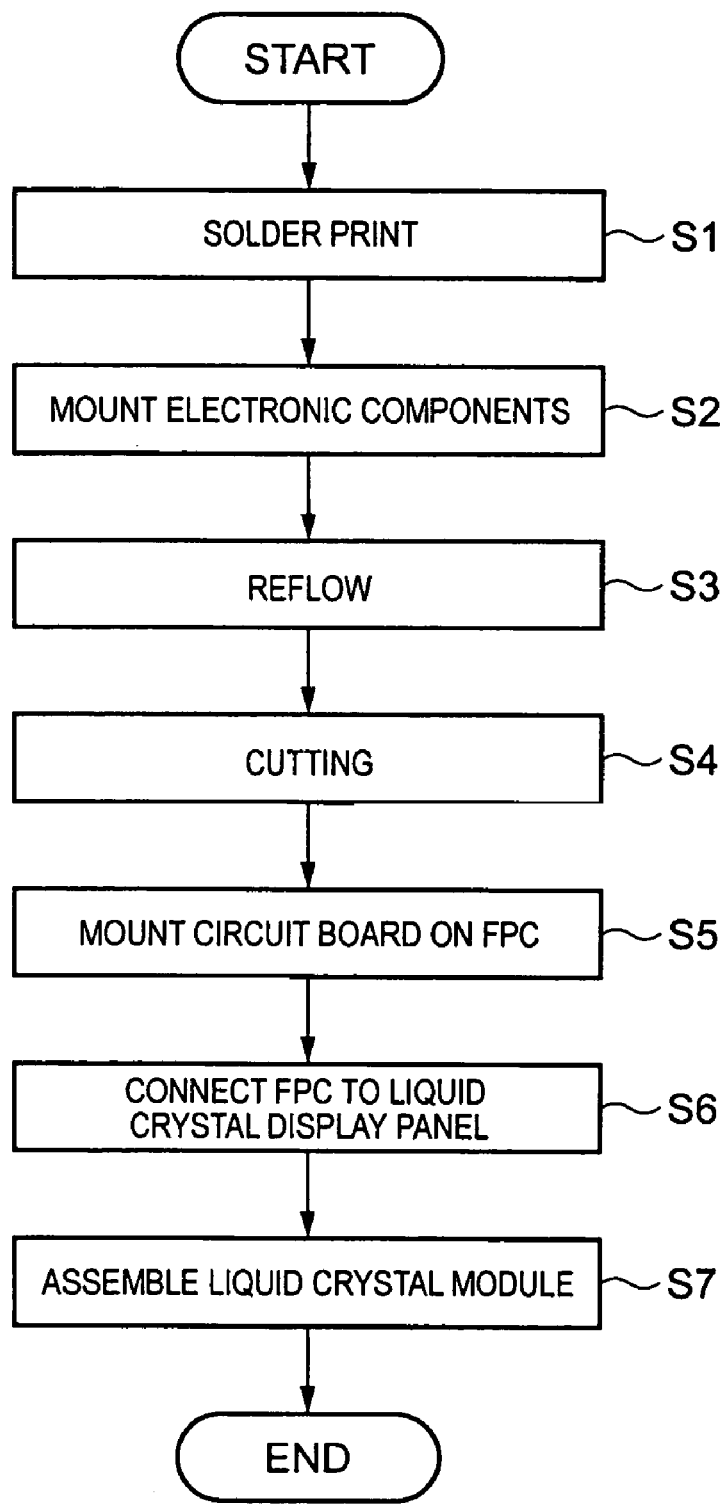

[FIG. 14]
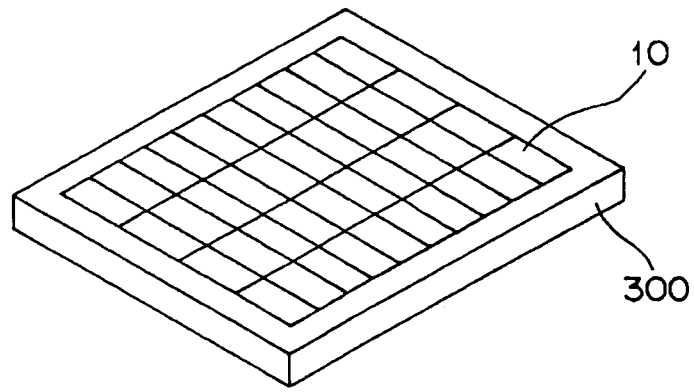
[FIG. 15]
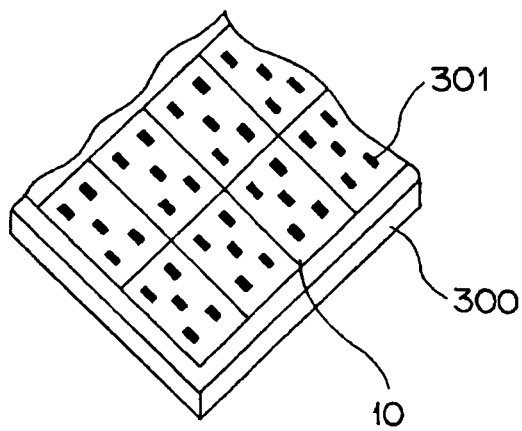
[FIG. 16]
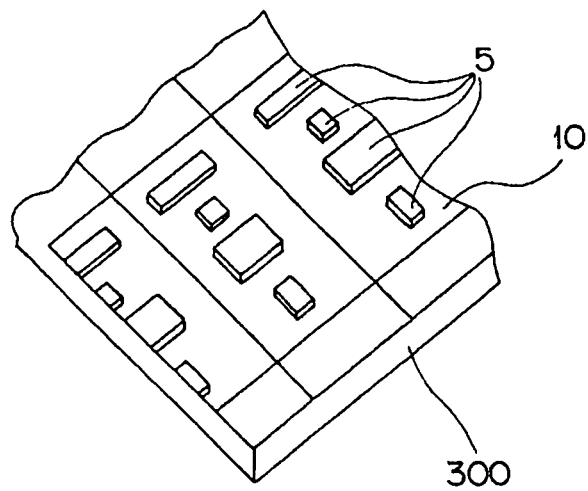

[FIG. 17]
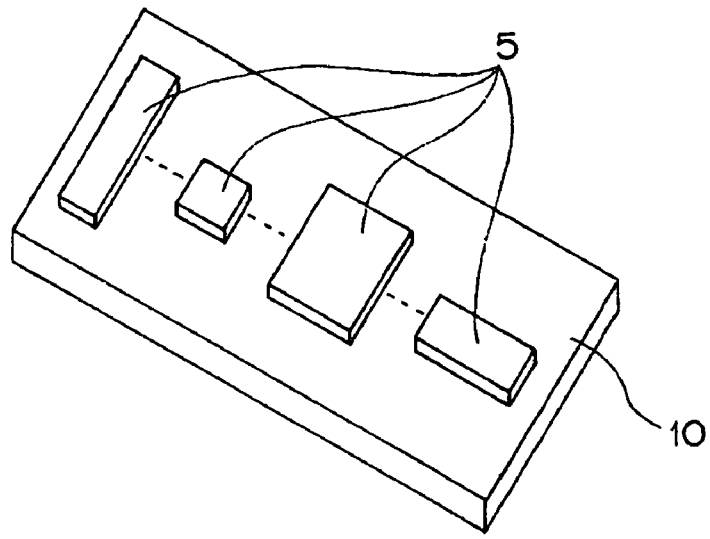
[FIG. 18]
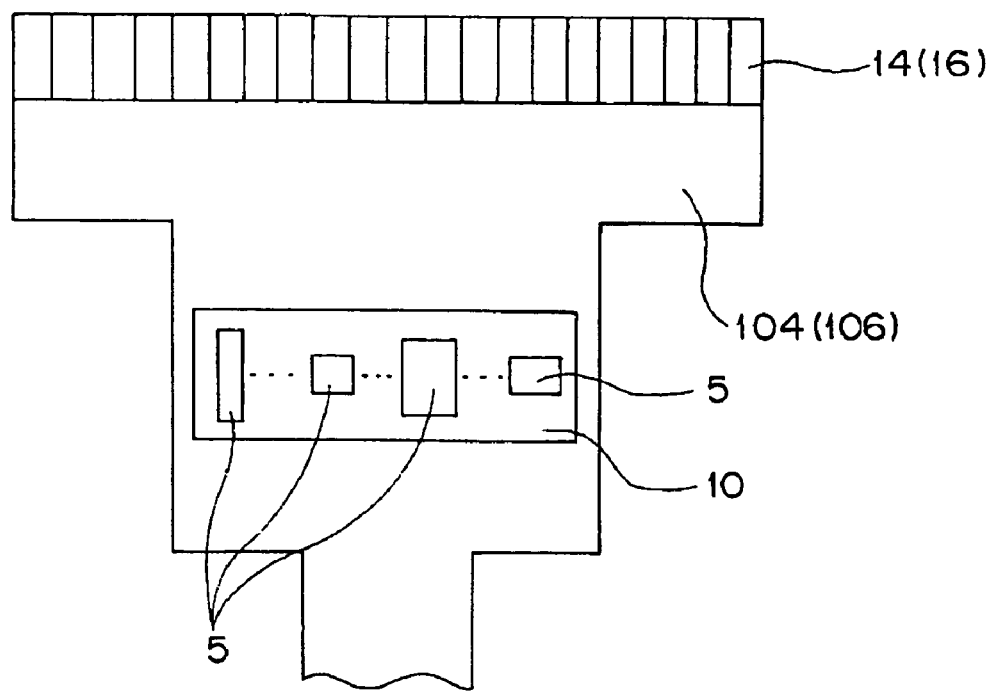

[FIG. 19]
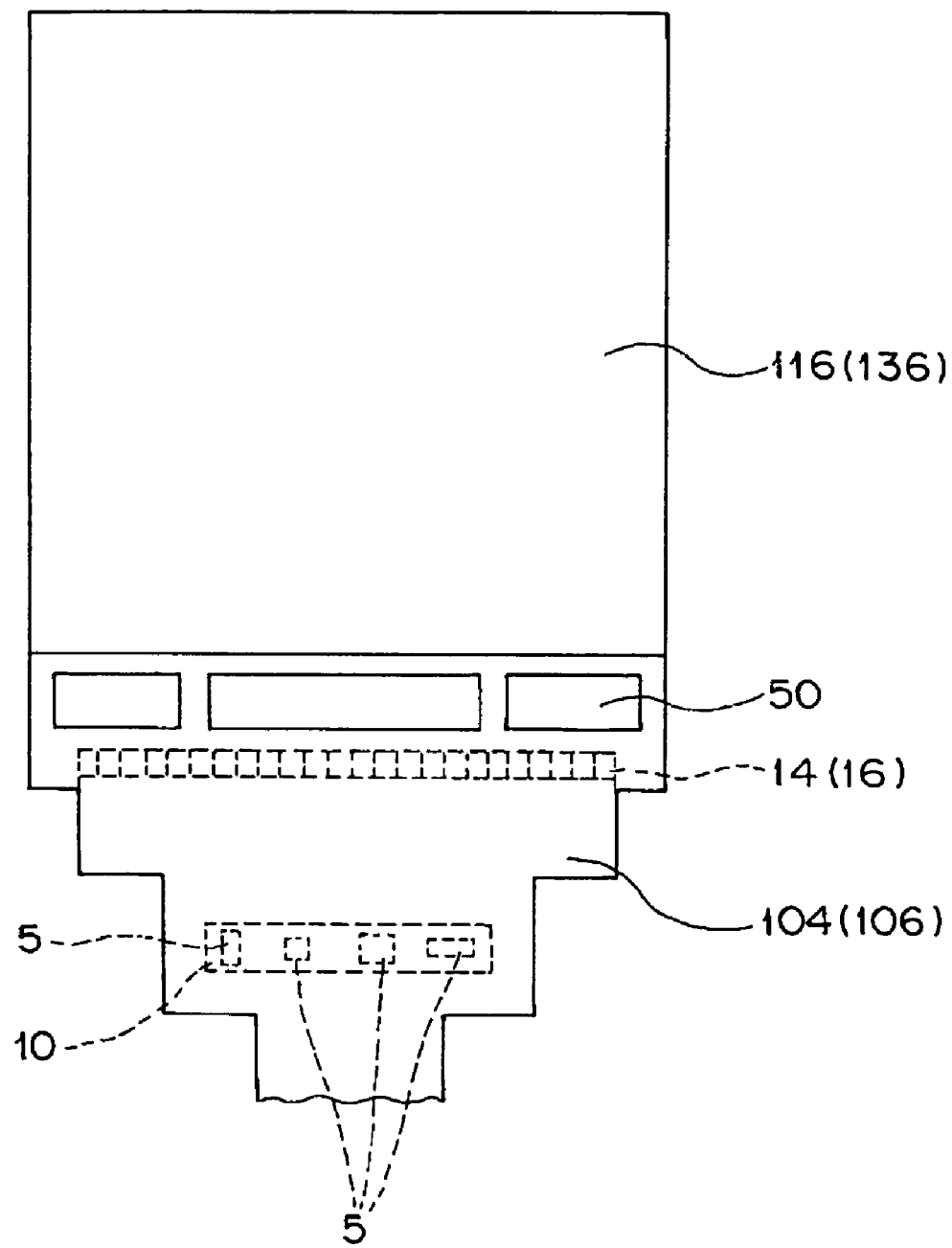

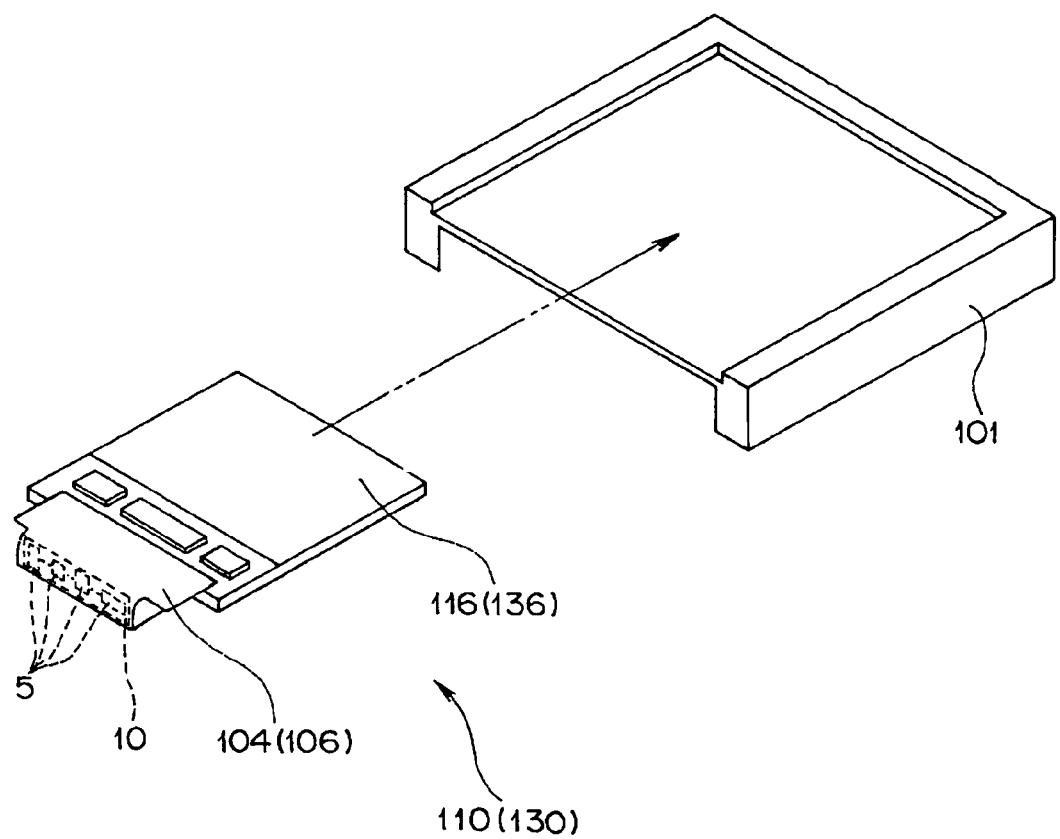
[FIG. 20]

[FIG. 21]
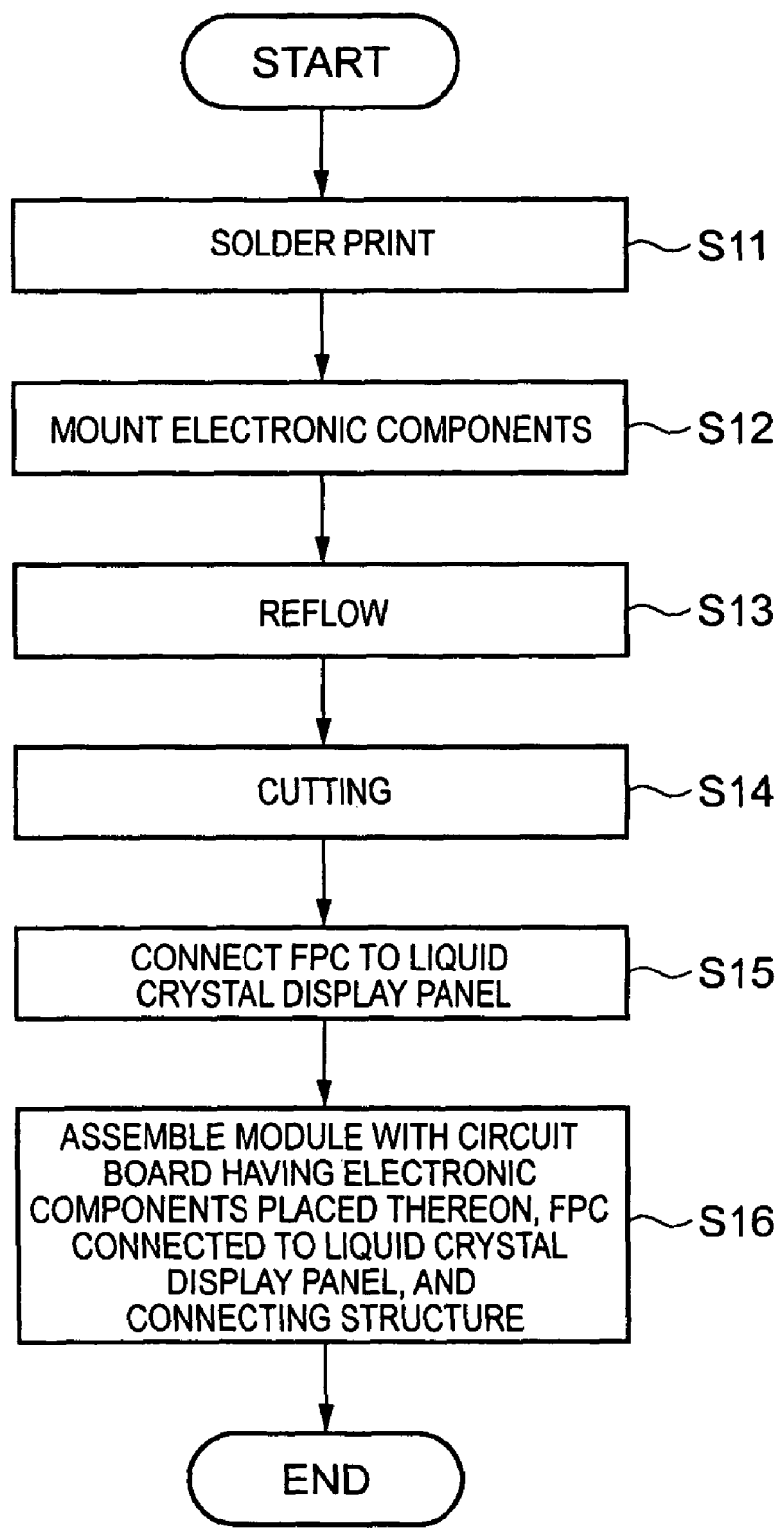

[FIG. 22]
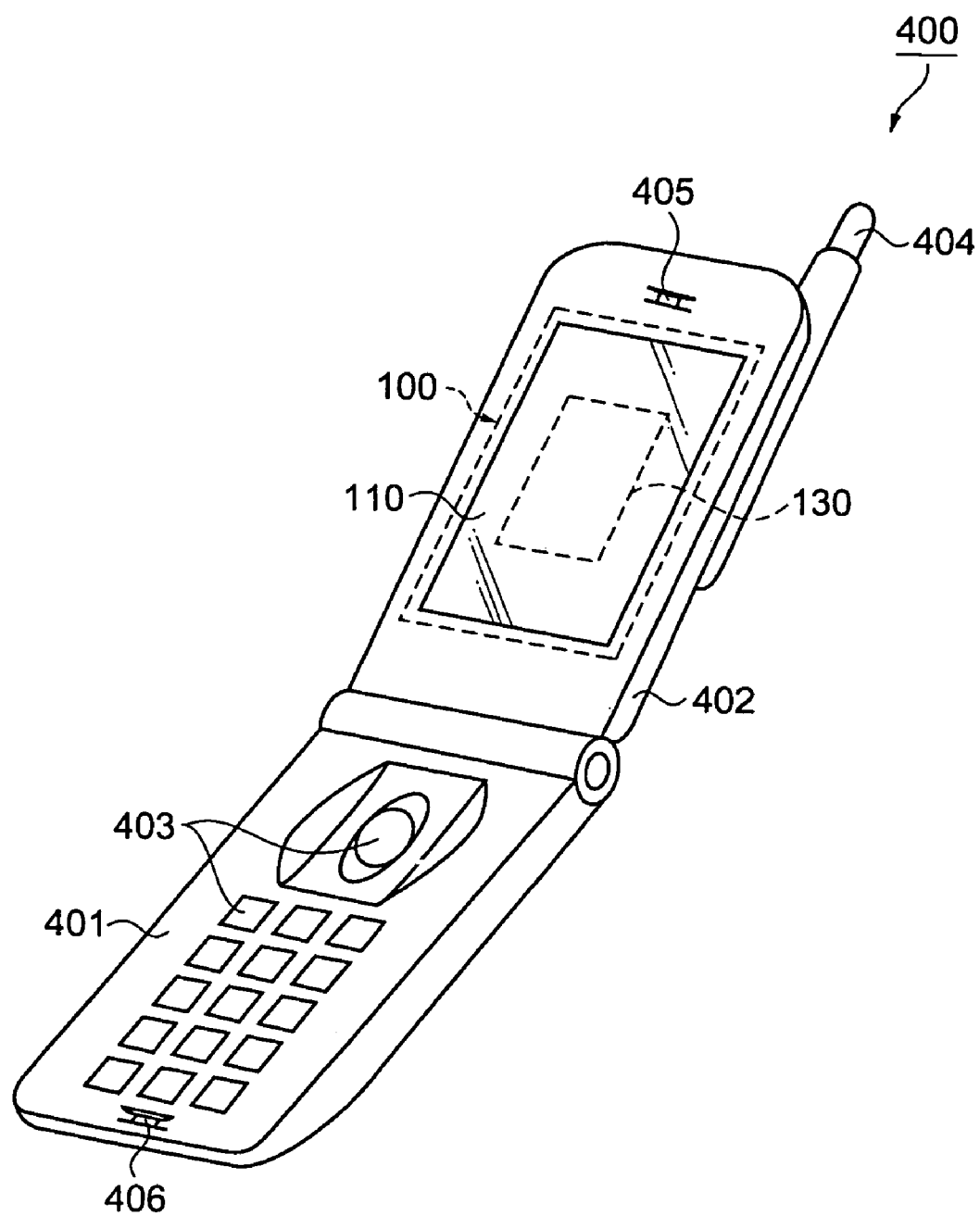

_US 8,072,765 B2_

ELECTRO-OPTICAL APPARATUS, FLEXIBLE PRINTED CIRCUIT BOARD, MANUFACTURING METHOD FOR ELECTRO-OPTICAL APPARATUS, AND ELECTRONIC EQUIPMENT

RELATED APPLICATIONS

This application claims priority to Japanese Patent Application Nos. 2003-327992 filed Sep. 19, 2003 and 2004-182455 filed Jun. 21, 2004 which are hereby expressly incorporated by reference herein in their entirety.

BACKGROUND

1. Technical Field

The present invention relates to an electro-optical apparatus, a flexible printed circuit board, a manufacturing method for an electro-optical apparatus, and electronic equipment.

2. Background Art

A principal portion of an electro-optical apparatus used as a display of electronic devices such as a mobile phone includes an electro-optical panel having an image display section using liquid crystal or the like as electro-optical material and being constituted of a plurality of picture elements, a drive circuit unit including electronic components required for driving the image display section, a flexible printed circuit (hereinafter, referred to as FPC) board for connecting electro-optical panel and electronic equipment body, and a light source unit including a light source emitting a light beam and a light guide plate or the like for guiding a light beam emitted from the light source to the image display section.

An LED chip, which is one type of light source, is packaged on the FPC connected at the output terminal thereof to the electro-optical panel, arranged inside a case in which the electro-optical panel is assembled together with the FPC, and emits a light beam to a light guide plate of the light source unit assembled in the case.

Here, the electronic components which constitute the aforementioned drive circuit unit include a driver IC for supplying a driving voltage, a power source IC for supplying a voltage to the driver IC, and a control IC for controlling the driver IC and the power source IC and so on. These electronic components are mounted on the FPC.

In a mounting method for these electronic components on the FPC, the FPC is positioned and adhered to a pallet as a guide plate. Subsequently, using, for example, a metal mask, a soldering pattern formed of solder paste is screen-printed at a desired position on the FPC adhered on the pallet, where a plurality of electronic components are mounted. Subsequently, the electronic components are mounted one-by-one on the printed soldering pattern using a device such as a chip mounter. Then, the pallet is passed through a re-flow furnace as is, and is heated for soldering. Thus, the plurality of electronic components is mounted on the FPC in this manner.

A technique for mounting a plurality of electronic components on an FPC is publicly known.

An electro-optical apparatus having a plurality of electronic components mounted on the FPC is also publicly known.

However, when mounting the plurality of electronic components on the flexible FPC using the aforementioned mounting method in the related art, there is a problem in that a significantly long time is required for mounting the electronic components, and hence workability is bad.

In addition, there are other problems such as the mounting position of the electronic components on the FPC may vary depending on the model of the designed electro-optical apparatus, and hence a jig for positioning the FPC on a pallet, the pallet, and a metal mask have to be prepared, thereby increasing the mounting cost. In addition, when the mounting density of the electronic components on the FPC is increased, the process yield is correspondingly lowered.

In view of such problems, it is an object of the present invention to provide an electro-optical apparatus in which a plurality of electronic components can be mounted on an FPC at a high mounting density with high operating efficiency at a low cost, and the FPC can be assembled in a small space, a flexible printed circuit (FPC) board, a manufacturing method for a electro-optical apparatus, and electronic equipment using the electro-optical apparatus.

SUMMARY

An electro-optical apparatus of the present invention includes an electro-optical panel having a display section, a flexible printed circuit board connected to the electro-optical panel via a terminal, and a circuit board on which electronic components are mounted, wherein the circuit board is mounted on the flexible printed circuit board.

According to the electro-optical apparatus of the present invention, the electronic components can be mounted on the flexible printed circuit board in a small space by packaging the electronic components used for the electro-optical apparatus together on the circuit board, and mounting the circuit board on the flexible printed circuit board. Also, the mounting cost may be reduced in comparison with the case in which the electronic components are directly mounted on the flexible printed circuit board.

In this case, the circuit board is preferably a hard single-layer or a multi-layer substrate. In this arrangement, the electronic components may be mounted on the circuit board at a high mounting density.

Also, in this case, the electro-optical panel includes a pair of substrates arranged so as to oppose each other via a sealing member, a light source unit for guiding a light beam from a light source for illuminating the electro-optical panel is further provided, the electro-optical panels overlap the light source unit and the flexible printed circuit board is electrically connected to one of the pair of substrates and are bent toward the light source unit.

In this arrangement, since the flexible printed circuit board is electrically connected to one of the pair of substrates constituting the electro-optical panel and is bent toward the light source unit disposed on the electro-optical panel, the flexible printed circuit board can be effectively disposed within the electro-optical apparatus.

In this case, preferably, the circuit board is arranged inside the flexible printed circuit board in a bent state.

In this arrangement, since the mounted circuit board and the mounted electronic components are prevented from protruding from the outline of the flexible printed circuit board in a bent state by mounting the circuit board on which the electronic components are mounted inside the flexible printed circuit board bent toward the light source unit, a space-saving electro-optical apparatus is obtained.

In this case, the circuit board is preferably arranged so as to oppose at least one of the substrates or the side surface of the light source unit. In this arrangement, the circuit board is arranged in the direction of the thickness of the electro-optical apparatus formed by overlapping the electro-optical panel and the light source unit, and hence a further space-saving electro-optical apparatus can be obtained.

In this case, it is also possible to arrange the circuit board outside the flexible printed circuit board in a bent state. In this arrangement, when mounting an electronic component which is taller than the light source, the circuit board can be disposed within the electro-optical apparatus in a small space by mounting the light source on the side of the flexible printed circuit board, bending the flexible printed circuit board so as to be closer to the light source unit, and mounting the circuit board outside the flexible printed circuit board in a bent state.

In this case, preferably, the flexible printed circuit board has two bent portions, and the circuit board is arranged between the two bent portions.

In this arrangement, the electro-optical apparatus formed by packaging the circuit board between the two bent portions of the flexible printed circuit board, and bending the flexible printed circuit board at these two bent portions can be disposed within the direction of the thickness of the electro-optical apparatus in a small space. In other words, a further space-saving electro-optical apparatus can be obtained.

In this case, preferably, the flexible printed board is provided with a projection and the circuit board is mounted on the projection. Also, preferably, the circuit board is partly supported by the projection in a state of protruding from the projection. Further preferably, the circuit board mounted on the projection projects in the direction substantially orthogonal to the bending direction of the flexible printed circuit board and is bent at the projection toward the flexible printed circuit board.

In this structure, the size of the projection can be reduced by mounting the circuit board on the projection of the flexible printed circuit board, and supporting the circuit board partly by the projection in a state of protruding from the projection. Therefore, no additional area is necessary when designing the flexible printed circuit board, and hence the cost can be reduced. In addition, by mounting the circuit board mounted on the projection so as to be projected substantially orthogonal to the bending direction of the flexible printed circuit board, it can be disposed at a desired position on the flexible printed circuit board by being bent at the projection toward the flexible printed circuit board.

In this case, the flexible printed circuit board includes two bent portions, and the projection projects between the two bent portions.

In this arrangement, the projection is formed so as to project from between the two bent portions of the flexible printed circuit board, and the circuit board is mounted on the projection. Then, the circuit board can be disposed within the direction of the thickness of the electro-optical apparatus in a small space by bending the flexible printed circuit board at two bending portions and bending the projection, on which the circuit board is mounted, further toward the flexible printed circuit board.

In this case, since the electro-optical apparatus of the present invention includes a supporting member having a storage section for storing the electro-optical panel and the light source unit, and the circuit board opposes one side surface of the supporting member.

In this arrangement, the supporting member is adapted to accommodate the electro-optical panel and the light source unit. Then, by bending the flexible printed circuit board connected to the electro-optical panel toward the optical unit so that the mounted circuit board opposes one side surface of the supporting member, the supporting member can be further downsized without securing a space for arranging the circuit board, on which the electronic components are mounted, within the supporting member. In other words, the circuit board can be disposed in a small space within the thickness of the electro-optical apparatus.

The flexible printed circuit board of the present invention is a flexible printed circuit board having input/output terminals wherein the circuit board on which the electronic components are mounted is mounted on at least one of the surfaces of the flexible printed circuit board.

In this arrangement, by mounting the electronic components together on the circuit board and mounting the circuit board on the flexible printed circuit board, a flexible printed circuit board on which the electronic components are mounted in a small space is obtained. In addition, the mounting cost may be reduced in comparison with the case in which the electronic components are directly mounted on the flexible printed circuit board.

In this case, preferably, the circuit board is a hard single-layer or a multi-layer substrate. In this arrangement, by mounting the circuit board on which the electronic components are mounted at a high density on the flexible printed circuit board, the flexible printed circuit board on which the electronic components are mounted in a smaller space can be obtained.

In this case, preferably, the flexible printed circuit board includes a projection, and the circuit board is mounted on the projection. Also, preferably, the circuit board is partly supported by the projection, and is supported in a state of protruding from the projection. Further preferably, the circuit board mounted on the projection projects in the direction substantially orthogonal to the bending direction of the flexible printed circuit board, and is bent toward the flexible printed circuit board at the projection.

In this arrangement, the size of the projection can be reduced by mounting the circuit board on the projection, partly supporting the circuit board by the projection, and supporting the circuit board in a state of protruding from the projection. Therefore, the flexible printed circuit board, in which reduction of the number of components to be mounted on the flexible printed circuit board caused by mounting the projection is prevented, may be obtained. Furthermore, when the circuit board mounted on the projection is projected in the direction substantially orthogonal to the bending direction of the flexible printed circuit board, the circuit board can be arranged at a desired position on the flexible printed circuit board by bending the projection.

A manufacturing method for an electro-optical apparatus according to the present invention is a manufacturing method for an electro-optical apparatus including an electro-optical panel having a display unit, and a flexible printed circuit board having an terminal, including a mounting step for mounting electronic components on a circuit board, a mounting step for mounting the circuit board on which the electronic components are mounted on the flexible printed circuit board, and a connecting step for connecting the electro-optical panel to the flexible printed circuit board on which the circuit board is mounted via the terminal.

In this arrangement, in the placing step, the electronic components required for operating the electro-optical apparatus are mounted on the circuit board, and in the mounting step, the circuit board is mounted on the flexible printed circuit board. In the connecting step, the electro-optical panel is connected to the flexible printed circuit board on which the circuit board is mounted via the terminal, whereby the electro-optical apparatus on which the electronic components are mounted in a small space can be manufactured. Also, the electro-optical apparatus can be manufactured with reduced cost for mounting in comparison with the case in which the electronic components are directly mounted on the flexible printed circuit board.

In this case, the manufacturing method of the present invention further includes a bending step for bending the flexible printed circuit board so that the circuit board is positioned in the area near along one side of the electro-optical panel.

In this arrangement, in the bending step, by bending the flexible printed circuit board so that the circuit board is disposed in the area near along one side of the electro-optical panel, a smaller electro-optical apparatus in which the circuit board is disposed within the electro-optical apparatus in a small space may be manufactured.

In this case, preferably, the circuit board is a hard single-layer or a multiple-layer substrate. In this arrangement, the electro-optical apparatus including the circuit board on which the electronic components for operating the electro-optical apparatus are mounted at a high density can be manufactured.

Electronic equipment according to the present invention includes the electro-optical apparatus according to the above-described invention mounted therein. In this arrangement, since the circuit board on which the electronic components are mounted is disposed within the electro-optical apparatus in a small space, and electro-optical apparatus, which is smaller and compact even when the light source unit for illuminating the electro-optical panel is provided, is mounted, smaller electronic equipment having a display unit for displaying information or the like may be provided.

BRIEF DESCRIPTION OF THE DRAWINGS

FIG. 1 is a cross-sectional view showing a liquid crystal display device according to an embodiment of the present invention.

FIG. 2 is an enlarged front view of a FPC in FIG. 1.

FIG. 3 is a partly enlarged cross-sectional view showing that an output terminal of the FPC in FIG. 2 having a circuit board mounted on one surface is connected to a liquid crystal display panel in FIG. 1.

FIG. 4 is a partly enlarged cross-sectional view showing that the output terminal of the FPC in FIG. 2 having the circuit board mounted on the other surface is connected to the liquid crystal display panel in FIG. 1.

FIG. 5 is a table showing specification of material for the circuit board.

FIGS. 6(*a*)-(*i*) are schematic cross-sectional views showing a manufacturing method for a multi-layer (four-layer) substrate.

FIG. 7(*a*)-(*b*) are schematic plan views showing a connecting terminal on the side of the FPC when mounting the circuit board on the FPC two-dimensionally.

FIG. 8 is a partly enlarged front view showing that a projection is formed on the FPC in FIG. 2, and the circuit board on which electronic components are mounted is mounted on the projection.

FIG. 9 is a partly enlarged perspective view showing that the circuit board mounted on the projection of the FPC in FIG. 8 is positioned between two bent portions of the FPC.

FIG. 10 is a partly enlarged front view showing a modification of the projection of the FPC in FIG. 8.

FIG. 11 is a schematic perspective view showing that the projection of the FPC on which the circuit board is mounted shown in FIG. 10 is disposed on one side surface of a case.

FIG. 12 is a perspective view of the liquid crystal display device showing that the circuit board is mounted on the FPC disposed in the area near along one side of the liquid crystal display panel.

FIG. 13 is a flowchart showing an assembling process of a liquid crystal display module of the liquid crystal display device in FIG. 1.

FIG. 14 is a perspective view of a mother board on which a plurality of circuit boards are formed.

FIG. 15 is a partly enlarged perspective view showing that cream solder is printed on the plurality of circuit boards, respectively.

FIG. 16 is a partly enlarged perspective view showing that electronic components are mounted on cream solder, which is printed on the plurality of circuit boards, respectively.

FIG. 17 is an enlarged perspective view of one circuit board shown in a state of being cut out from the mother board, on which the plurality of circuit boards having the electronic components mounted thereon are formed.

FIG. 18 is a partial front view showing that one circuit board is mounted on the FPC.

FIG. 19 is a partial front view showing that the FPC on which one circuit board is mounted is connected to the liquid crystal display module.

FIG. 20 is a perspective view showing that the liquid crystal display module connected to the FPC is assembled within the case.

FIG. 21 is a flowchart showing a modification of the assembling process of the liquid crystal display module.

FIG. 22 shows an appearance of a mobile phone on which the liquid crystal display device is mounted.

DETAILED DESCRIPTION

Referring now to the drawings, embodiments of the present invention will be described. In the present embodiments, a liquid crystal display device using a TFD (Thin Film Diode) will be described as an example of the electro-optical apparatus. Therefore, a first substrate, which is one of a pair of substrates constituting the liquid crystal display, is a TFD substrate. As the liquid crystal display device, a back surface integrated liquid crystal display device having two liquid crystal display modules will be described as an example.

First Embodiment

FIG. 1 is a cross-sectional view showing a liquid crystal display device according to an embodiment of the present invention. In the description, a surface on the upper side of the drawing is designated as a front surface, and a surface on the lower side of the drawing is designated as a back surface for convenience of explanation.

As shown in FIG. 1, a liquid crystal display device 100 as an electro-optical apparatus is a so-called back surface integrated liquid crystal display device including a first liquid crystal display module 110 and a second liquid crystal display module 130 as principal components.

The first liquid crystal display module 110 includes a first liquid crystal display panel 116 as an electro-optical panel having a display section, an FPC (flexible printed circuit) board 104 electrically connected to the first liquid crystal display panel 116, a circuit board 10 on which an electronic component 5 is mounted, and a backlight unit 120 as a light source unit for guiding a light beam from a light source unit 121 (hereinafter, referred to as a light source) for illuminating the first liquid crystal display panel 116.

The first liquid crystal display panel 116 includes a TFD substrate 111, which corresponds to the first substrate, and an opposing substrate 112, which corresponds to the second substrate opposed thereto, arranged so as to oppose each other via a sealing member 113, and a liquid crystal 114, which corresponds to an electro-optical material, interposed within the internal space. Deflecting plates 145, 117 are adhered on the front surface and the back surface of the first liquid crystal display panel 116.

The backlight unit 120 includes a light source 121, a reflecting plate 102, a light guide plate 122, and a light-shielding double-face adhesive tape 103.

The first liquid crystal display panel 116 and the backlight unit 120 are adhered via the light-shielding double-face adhesive tape 103. The light guide plate 122 is overlapped on the front surface of the reflecting plate 102. The light-shielding double-face tape 103 is overlapped on the outer peripheral portion of the front surface of the light guide plate 122. The FPC 104 is electrically connected to the TFD substrate 111 of the first liquid crystal display panel 116 via the output terminal thereof. The light source 121 is mounted on the surface of the FPC 104, and the surface of the light source 121 is adhered so as to be flush with the surface of the light guide plate 122 using, for example, an adhesive tape.

The second liquid crystal display module 130 includes a second liquid crystal display panel 136 as the electro-optical panel having a display unit, the a 106 electrically connected to the second liquid crystal display panel 136, the circuit board 10 on which the electronic component 5 is mounted, and a backlight unit 140, which corresponds to a light source unit for guiding a light beam from a light source 141 for illuminating the second liquid crystal display panel 136.

The second liquid crystal display panel 136 includes a TFD substrate 131, which corresponds to the first substrate, an opposing substrate 132, which corresponds to the second substrate opposed thereto, arranged so as to oppose each other via a sealing member 133, and a liquid crystal 134, which corresponds to the electro-optical material, interposed within the internal space. Deflecting plates 135, 137 are adhered on the front surface and the back surface of the second liquid crystal display panel 136.

The backlight unit 140 includes the light source 141, the reflecting plate 102, a light guide plate 142, and a light-shielding double-face adhesive tape 105.

The second liquid crystal display panel 136 and the backlight unit 140 are adhered via a light-shielding double-face adhesive tape 105. The light source 141 and the light guide plate 142 are overlapped on the back surface of the reflecting plate 102. The light-shielding double-face tape 105 is overlapped on the outer periphery of the back surface of the light guide plate 142. The FPC 106 is electrically connected to the TFD substrate 131 of the second liquid crystal display panel 136 via the output terminal thereof.

Therefore, the first liquid crystal display module 110 and the second liquid crystal display module 130 are disposed so as to be substantially symmetry with respect to the reflecting plate 102.

Electrode patterns, not shown, are formed on the opposing surfaces of the TFD substrate 111 and the opposed substrate 112 of the first liquid crystal display panel 116, and the opposing surfaces of the TFD substrate 131 and the opposing substrate 132 of the second liquid crystal display panel 136, respectively, and the electrode patterns change the orientations of the liquid crystal 114 and the liquid crystal 134, respectively depending on the voltage applied by the FPC 104 and the FPC 106. The first liquid crystal display panel 116 and the second liquid crystal display panel 136 include an image display section, not shown, having a plurality of picture elements. The circuit boards 10 each including a hard multi-layer substrate on which the plurality of electronic components 5, described later, are mounted, is mounted on the FPC 104 and the FPC 106, respectively.

The light source 121 of the backlight unit 120 emits a light beam to one end surface of the light guide plate 122, and the light source 141 of the backlight unit 140 emits a light beam to one end surface of the light guide plate 142. The light guide plate 122 and the light guide plate 142 each include a diffusion sheet, not shown, and a prism sheet having two layers, and a light-shielding double-face adhesive tape overlapped on the surfaces thereof, respectively, and the reflecting plate 102 is overlapped on the back surface of the light guide plate 122 and the front surface of the light guide plate 142.

The light guide plate 122 guides a light beam from the light source 121 inside thereof, and emits the light beam to the first liquid crystal display panel 116 by reflecting the light beam on the front surface of the reflecting plate 102. Likewise, the light guide plate 142 guides a light beam from the light source 141 inside thereof, and emits the light beam to the second liquid crystal display panel 136 by reflecting the light beam on the front surface of the reflecting plate 102.

The light-shielding double-face adhesive tape 103 prevents a light beam emitted from the light source 121 from incoming directly into the first liquid crystal display panel 116, and allows a light beam emitted from the light guide plate 122 to enter into an image display area of the image display unit of the first liquid crystal display panel 116. The light-shielding double-face adhesive tape 105 prevents a light emitted from the light source 141 from incoming directly into the second liquid crystal display panel 136 and allows a light beam emitted from the light guide plate 142 to enter into an image display area of the image display section of the second liquid crystal display panel 136.

The liquid crystal display device 100 having the principal portion configured as described above is assembled into a case 101, which corresponds to a supporting member formed, for example, of synthetic resin. Subsequently, referring to FIG. 2 to FIG. 6, the structure of the FPC which is connected to the TFD substrate 111 and the TFD substrate 131 via the output terminals will be described.

FIG. 2 is an enlarged front view of the FPC 104 and FPC 106 shown in FIG. 1 according to the first embodiment of the present invention. FIG. 3 is a partly enlarged cross-sectional view showing that the output terminal of the FPC shown in FIG. 2, on which the circuit board is mounted on one surface, is connected to the liquid crystal display panel sown in FIG. 1. FIG. 4 is a partly enlarged cross-sectional view showing that the output terminal of the FPC, on which a hard circuit board is mounted on the other surface, is connected to the liquid crystal display panel in FIG. 1. The following description is made on the first liquid crystal display module 110.

As shown in FIG. 2, an output terminal 14 to be connected to the TFD substrate 111 of the first liquid crystal display panel 116 is formed at one end of the FPC 104, and an input terminal 15 to be connected to the control circuit unit, not shown, and the like of electric equipment such as a mobile phone is formed at the other end of the FPC 104.

A plurality of electronic components 5 are mounted on at least one of a front surface 104a, which corresponds to one of the surfaces of the FPC 104 and a back surface 104b, which corresponds to the other surface, and the circuit board 10 on which the plurality of electronic components 5 are mounted is mounted on the front surface 104a of the FPC 104. It is also possible to mount the circuit board 10 on the back surface 104b of the FPC 104.

The plurality of electronic components 5 are, for example, an LED as the light source 121, a resistance for the oscillation circuit of the light source 121, a capacitor for a protective circuit of the light source 121, and a diode, and are mounted on at least one of the front surface 104a and the back surface 104b of the FPC 104.

The plurality of electronic components 5 represent electronic components which can share, for example, a driving IC, which is a driver circuit for supplying a driving voltage for applying a voltage to the liquid crystal 114 within the first liquid crystal display panel 116, a power source IC, which corresponds to a power source circuit for supplying a voltage to the driver circuit, and a resistance for an oscillating circuit, and are mounted on the circuit board 10. The driving IC may be mounted as a driver IC 50 on the TFD substrate 111 of the first liquid crystal display panel 116, as shown in FIG. 3 and FIG. 4.

Subsequently, the circuit board will be described based on FIG. 5. FIG. 5 is a table showing specification of material for the circuit board. As shown in FIG. 5, the circuit board 10 of the present embodiment employs a hard multi-layer substrate (four layers). The core employs epoxy resin copper-coated laminated plate (ELC-4785G) manufactured by Sumitomo Bakelite Company Limited, and desired circuit patterns are formed on the front and back surfaces thereof. The circuit patterns formed on the front and back surfaces are electrically connected at the required positions depending on copper-plated IVH (Interstitial Via Hole). The circuit board 10 includes a four-layered circuit patterns which connect circuit patterns on the surface of the build and circuit patterns on the core electrically by laminating build (phenol resin copper-plated laminated plate APL-4601 manufactured by Sumitomo Bakelite Company Limited) on the front and back surfaces of the core, and plating copper on the hole formed on the build. The surface of the circuit board 10 is formed with a plurality of contact points formed, for example, by photolithography at predetermined positions.

FIG. 6 is a schematic cross-sectional view showing a manufacturing method for a multi-layer (four-layer) substrate. FIGS. 6(a)-(i) are schematic cross sectional view showing the process in sequence.

In FIG. 6(a), punching for IVH 22 is performed at predetermined positions based on the circuit pattern design of the core member 20 by NC process.

In FIG. 6(b), the core member 20 with a punched hole is plated with copper (about 10 µm in thickness).

In FIG. 6(c), desired circuit patterns are formed by etching by photolithography on the front and back surfaces of the core member 20 on which copper is plated.

In FIG. 6(d), a build member 21 having a copper foil (12 µm) on the front and back surfaces of the core member 20 formed with the circuit patterns is laminated. The build member 21 includes an uncured resin layer called pre-preg, which can be adhered to the core member 20 by being placed on the core member 20 and thermally compressed thereto.

Following the aforementioned steps, there is a film thinning step for etching the copper foil of the build member 21 into the thickness about 6 µm, though it is not shown. This is performed for preventing the patterning accuracy from being deteriorated because the copper foil layer on the surface of the build member 21 becomes excessively thick in the course of the following steps.

In FIG. 6(e), the copper foil on the surface of the build member 21 is partly etched and the pattern which serves as a mask for the subsequent laser punching is formed.

In FIG. 6(f), an opening 23 of the mask pattern shown in the same drawing (e) is punched with laser. Punched holes 24a, 24b are for electrically connecting the circuit pattern formed on the core member 20 and plated with copper subsequently and the circuit pattern formed on the build member 21. When it is necessary to connect the circuit patterns formed on the front and back surfaces of the build member 21 due to design of the circuits on the respective layers of the circuit board 10, a through-hole 25 is formed by a NC process.

In FIG. 6(g), copper is plated on the layered plate finished through the above-described steps (about 10 µm in thickness). Accordingly, the aforementioned laser-punched portions (holes 24a, 24b), NC-punched potion (through hole 25) are plated and electrical connection between the copper foil portions on the upper layer and the lower layer of the respective punched portion is established.

In FIG. 6(h), the holes 24a, 24b are further plated selectively with copper to flatten the copper foil layer on the surface of the build member 21.

In FIG. 6(g), the copper foil of the build member 21 is etched by photolithography to form an outer pattern.

Subsequently, the circuit board 10 passed through the aforementioned steps is formed with a solder resist on the outer pattern for preventing short circuit of the outer pattern in the course of soldering of the electronic components due to solder. Further, the surface of a land (terminal) on which the electronic components are mounted thereon is plated with nickel through a nonelectrolytic deposition method, and then plated with Au (gold) also through the nonelectrolytic deposition method for securing solderability.

In addition to the steps described above, there is a performance inspection step for detecting electrical disconnection or short circuit of the formed circuit pattern and an appearance inspection step for detecting problems in appearance, although not shown in the drawings. The circuit board 10 is completed after having passed these inspection steps.

While the circuit board 10 of the present embodiment employs the hard multi-layer substrate, when the driving IC or the like for supplying a driving voltage to the liquid crystal display panel, which is an electro-optical panel, for example, are two-dimensionally mounted directly on the terminal section of the liquid crystal panel, the number of electronic components to be mounted on the circuit board 10 is reduced. Therefore, a single-layer substrate which is simpler in structure may be employed as the circuit board 10.

Subsequently, the mounting configuration on the FPC 104 and the circuit board 10 will be described in detail. As shown in FIG. 3 and FIG. 4, the output terminal 14 of the FPC 104 is connected to a terminal on the TFD substrate 111 of the first liquid crystal display panel 116, and the circuit board 10 is mounted on the front surface 104a of the FPC 104, which corresponds to the bent portion of the FPC 104 when the FPC 104 is bent toward the backlight unit 120 along one side of the liquid crystal display panel 116, so that the surface of the circuit board 10 extends in substantially parallel with one end surface of the backlight unit 120, that is, so that it opposes to the side surface of the backlight unit 120.

In the following description of the circuit board 10, the direction parallel with one side of the FPC 104, which is formed when the FPC 104 is bent along the one side of the first liquid crystal display panel 116, is referred to as a longitudinal direction, the direction orthogonal to the one side and parallel with the surface of the FPC 104 is referred to as a widthwise direction, and the direction orthogonal to the one side and orthogonal to the surface of the FPC 104 is referred to as a height direction.

More specifically, as shown in FIG. 3, when the output terminal 14 of the FPC 104 is connected to the terminal of the TFD substrate 111 of the first liquid crystal display panel 116 and the FPC is bent along one side of the first liquid crystal display panel 116, the FPC 104 is formed with two bent portions 43, 44 between the output terminal 14 and the input terminal 15, and between the first liquid crystal display panel 116 and the backlight unit 120.

By mounting the circuit board 10 on the surface 104a of the FPC 104 so as to be positioned between the two bent portions 43, 44, the circuit board 10 can be disposed within two planes having a distance equivalent to the sum of the thickness of the backlight unit 120 in the direction orthogonal to the surface of the light guide plate 122 (hereinafter, referred to as the direction of height of the backlight unit 120) and the thickness thereof in the direction orthogonal to the surface of the opposed substrate 112 (hereinafter, referred to as a direction of the height of the opposed substrate). In other words, the circuit board 10 can be disposed within a space having a distance in the direction orthogonal to the surface of the TFD substrate 111 of the first liquid crystal display module 110 (hereinafter, referred to as a direction of the height of the liquid crystal display module 110).

Therefore, since the length a of the circuit board 10 in the width direction is significantly larger than the mounting height β, which corresponds to the length in the direction of the height thereof, the circuit board 10 can be disposed compactly within the height of the first liquid crystal display module 110 in the direction substantially orthogonal to the direction of the height of the first liquid crystal display module 110 by disposing the width of the circuit board 10 coincides with the height direction of the first liquid crystal display module 110, and hence the circuit board 10 can be disposed within the first liquid crystal display module 110 in a small space by.

Also, the circuit board 10 can be disposed in a small space within the first liquid crystal display module 110 when being mounted on the back surface 104b of the FPC 104 so as to be positioned between the two bent portions 43, 44 of the FPC 104, as shown in FIG. 4.

FIG. 7 is a schematic plan view showing a connecting terminal on the side of the FPC when mounting the circuit board on the FPC two-dimensionally. As a method of mounting the circuit board 10 on the FPC 104 two-dimensionally, there is a method of forming connecting terminals 30 on the surface of the FPC substrate, and connecting the circuit board 10 by soldering as shown in FIG. 7(a). Alternatively, as shown in FIG. 7(b), a method of providing connecting terminals 31 on the FPC substrate, printing cream solder corresponding to the connecting terminals 31, laminating the circuit board thereon and soldering the same by a re-flow method to establish connection is conceivable. In either case, the connecting terminal corresponding to the connecting terminals 30 or 31 is formed on the surface of the circuit board 10, which is mounted on the FPC.

Although the case in which the circuit board 10 is soldered to the FPC 104 has been described in the present embodiment, it is also possible as an electrically connecting method to form the connecting terminals as described above on the circuit board 10 and the FPC 104 respectively and bringing them into press-contact via a connecting structure (for example, a rubber connector).

The size, pitch and alignment of the connecting terminals 30 or 31 on the side of the FPC may be determined corresponding to the mounting method of the circuit board 10.

As another method of electrically connecting the circuit board 10 to the FPC 104, a projection is integrally formed with, or separately connected to, the FPC 10, and the circuit board 10 is mounted on the projection by soldering or a method using anisotropic conductor such as ACF or a connector. Then, the circuit board 10 may be positioned between the two bent portions 43, 44 by deforming the aforementioned projection by bending the same.

More specifically, FIG. 8 is a partly enlarged front view showing that a projection is formed on the FPC in FIG. 2, and the circuit board on which the electronic components are mounted is mounted on the projection. FIG. 9 is a partly enlarged perspective view showing that the circuit board mounted on the projection of the FPC in FIG. 8 is positioned between two bent portions of the FPC.

As shown in FIG. 8, a projection 46 is integrally formed at, or separately connected to, the right end of the FPC 104 between two bent portions 43, 44. The circuit board 10 is mounted on the front surface 46a or the back surface 46b of the substantially extremity of the projection 46. In other words, part of the circuit board 10 is supported at the extremity of the projection 46, and is in a state of protruding from the FPC 104 and, simultaneously, projected in the direction substantially orthogonal to the bending direction of the FPC 104. In this state, the output terminal 14 of the FPC 104 is connected to the TFD substrate 111 of the first liquid crystal display panel 116, the FPC 104 is bent along one side of the first liquid crystal display panel 116 toward the backlight unit 120, and the front surface 46a of the projection 46 is bent so as to oppose the front surface 104a between the two bent portions 43, 44 of the FPC 104 (See FIG. 9). Alternatively, the back surface 46b of the projection 46 is bent so as to oppose the back surface 104b between the two bent portions 43, 44 of the FPC 104.

Accordingly, since the circuit board 10 is positioned between the two bent portions 43, 44 of the FPC 104, as described above, the circuit board can be disposed within two planes having a distance equivalent to the sum of the thickness of the backlight unit 120 in the direction of the height and the thickness of the opposing substrate 112 in the direction of the height thereof. Also, in comparison with the case in which the circuit board 10 is mounted two-dimensionally on the FPC 104 (See FIGS. 2 to 4), when the circuit substrate 10 is mounted on the projection 46, bending property (flexibility) of the FPC 104 body can be prevented from being impaired.

In addition, the position of the projection 46 integrally formed with, or separately connected to, the FPC 104 is not limited to the right end between the two bending portion 43, 44 of the FPC. The position can be changed as needed based on the design of the liquid crystal display device, which corresponds to an electro-optical apparatus.

For example, FIG. 10 is a partly enlarged front view showing a modification of the projection of the FPC in FIG. 8. FIG. 11 is a schematic perspective view showing that the projection of the FPC in FIG. 10 is disposed on one side surface of the case, and the circuit board 10 is packaged on the projection.

As shown in FIG. 10, the projection 47 is formed integrally with, or separately connected to, the FPC 104 downwardly of the right end of the FPC 104. The circuit board 10 is mounted on the front surface 47a or the back surface 47b at the substantially extremity of the projection 47. In this state, the circuit board 10 is disposed at a desired position within the first liquid crystal display module 110 by connecting the output terminal 14 of the FPC 104 to the TFD substrate 111 of the first liquid crystal display panel 116, bending the FPC 104 along one side of the first liquid crystal display panel 116 toward the backlight unit 120, and deforming the front surface 47a or the back surface 47b of the projection 47.

Consequently, since the circuit board 10 can be disposed along one side of the liquid crystal display panel 116 of the first liquid crystal display module 110, the circuit board 10 can be disposed on the first liquid crystal display module 110 in a small space.

The projection 47 may be disposed not only on the first liquid crystal display module 110, but also along one side surface of the case 101. More specifically, as shown in FIG. 11, in a first place, the output terminal 14 of the FPC 104 is connected to the first liquid crystal display panel 116 (See FIG. 1) of the first liquid crystal display module 110, and the FPC 104 is bent along one side of the first liquid crystal display panel 116 toward the backlight unit 120.

Subsequently, the first liquid crystal display module 110 is assembled to the case 101 formed, for example, of synthetic resin or the like together with the second liquid crystal display module 130. Subsequently, the projection 47 of the FPC 104 is disposed, for example, on the right side surface on the outer side of the case 101, and the circuit board 10 is mounted on the front surface 47a of the substantially extremity of the projection 47. Therefore, since the circuit board 10 can be placed on one side surface of the case 101, the circuit board 10 can be disposed in a small space.

The embodiment described above has been described using the first liquid crystal display module 110. However, the same effects as the present embodiment may be achieved when it is used for the second liquid crystal display module 130 as a matter of course.

The circuit board 10 may be mounted on the FPC so as to be positioned in the area near along one side of the liquid crystal display panel. More specifically, FIG. 12 is a perspective view of the liquid crystal display device showing that the circuit board is mounted on the FPC disposed in the area near along one side of the liquid crystal panel.

As shown in FIG. 12, the second liquid display module 130 is disposed on the back surface of the liquid crystal display device 100, and the second liquid display panel 136 is disposed at substantially the center of the second liquid crystal display module 130.

On the second liquid crystal display module 130 and in the area near the left edge and the lower edge which is one side of the second liquid crystal display panel 136, a FPC 154 having, for example, a substantially L-shape on the side of the input terminal is disposed, and on the FPC 154 and in the area near the left edge which corresponds to one side of the second liquid crystal display panel 136, the circuit board 10 is mounted.

An input terminal 154a of the FPC 154 is connected to a connector unit 156 disposed on the second liquid crystal display module 130; and an input terminal of a FPC 206 having a substantially inverted L-shape disposed in the area near the right upper edge and the right edge, which corresponds to two sides of the second liquid crystal display panel 136 is connected to the connector unit 156. The circuit board 10 is mounted on the FPC 206 and in the area near the right edge, which is one side of the second liquid crystal panel 136.

Therefore, the circuit board 10 can be disposed in a small space by being positioned in the area near along one side of the second liquid crystal display panel 136 on the second liquid crystal display module 130.

The FPC 154 and the FPC 206 may be disposed on the first liquid crystal display module 110 in the area near along one side of the first liquid crystal display panel 116. In this case, the circuit board 10 is positioned in the area near along one side of the first liquid crystal display panel 116. The circuit board 10 may be located at any position as long as it is positioned in the area near along one side of the liquid crystal display panel.

As shown in FIG. 11, it is also possible to provide the projection 47 on the FPC 104, mount the circuit board 10 on the front surface or the back surface of the substantially extremity of the projection 47, and bend the projection 47, so that the circuit board 10 is disposed in the area near along one side of the liquid crystal display panel.

Subsequently, a manufacturing method for the liquid crystal display device 100 showing an embodiment of the present invention arranged as described above will be described based on FIG. 13 to FIG. 20.

FIG. 13 is a flowchart showing an assembling process of the liquid crystal display module 110 or the liquid crystal display module 130 of the liquid crystal display device in FIG. 1. FIG. 14 is a perspective view of the circuit board of a mother board on which a plurality of circuit boards are formed thereon. FIG. 15 is a partly enlarged perspective view showing that cream solder is printed on the plurality of circuit boards, respectively. FIG. 176 is a partly enlarged perspective view showing that electronic components are mounted on cream solder, which is printed on the plurality of circuit boards, respectively. FIG. 17 is an enlarged perspective view of one circuit board shown in a state of being cut out from the mother board, on which the plurality of circuit boards having the electronic components mounted thereon are formed. FIG. 18 is a partial front view showing that one circuit board is mounted on the FPC. FIG. 19 is a partial front view showing that the FPC on which one circuit board is mounted is connected to the liquid crystal display module. FIG. 20 is a perspective view showing that the liquid crystal display module connected to the FPC is assembled within the case.

The description shown below is made by exemplifying the first liquid crystal display module 110.

As shown in FIG. 13, a mother board 300 on which the plurality of circuit boards 10 each having a contact point formed thereon are dividedly arranged is prepared (See FIG. 14). In Step S1, cream solder 301 is printed on the plurality of circuit boards 10 at given positions respectively, for example, by screen printing (See FIG. 14). Then the procedure goes to Step S2.

In Step S2, a predetermined number of the electronic components 5 are mounted on the plurality of circuit boards 10 at the positions where the cream solder 301 is printed, respectively (See FIG. 16) using a mounter device or the like. Then the procedure goes to Step S3.

In Step S3, the cream solder 301 is melted by heating the mother board 300 in the re-flow furnace and soldering the plurality of electronic components 5 on the plurality of circuit boards 10. Then the procedure goes to Step S4.

In Step S4, after having conducted an inspection whether or not the plurality of electronic components 5 are correctly soldered on the circuit boards 10, the plurality of circuit boards 10 are cut out from the mother board 300 into units (See FIG. 17) using a dicer or the like. Then, the procedure goes to Step S5.

In step S5, the FPC 104 is prepared, and one circuit board 10 on which the plurality of electronic components 5 are mounted is soldered on the front surface or the back surface of the FPC 104 (See FIG. 17). Then, the procedure goes to Step S6. Applicable methods other than soldering include a method of mounting using anisotropic conductor such as ACF, a connector, or rubber.

In Step S6, after having conducted an inspection whether or not the circuit board 10 is correctly mounted on the FPC 104, the output terminal 14 of the FPC 104 on which the circuit board 10 is mounted is connected to the liquid crystal display panel 116 (See FIG. 16). The connecting method employed here uses the ACF. In this case, the input terminal 15 side of the FPC 104 is bent along one side of the first liquid crystal display panel 116 and is adhered to the light-shielded double-face adhesive tape 103 (See FIG. 1). Then, the procedure goes to Step S7.

In Step S7, after having conducted an inspection whether or not the FPC 104 is correctly mounted on the liquid crystal display panel 116, the liquid crystal display panel 116 to which the FPC 104 is connected is assembled (accommodated) within the case 101 (See FIG. 20). In this manner, the liquid crystal display module is completed.

In a manufacturing method for a liquid crystal display device according to the present embodiment, since the circuit board is mounted on the FPC after having mounted the plurality of electronic components on the circuit board, working efficiency is satisfactory, the mounting density of the electronic components may be increased, and the FPC can be assembled in a small space within the case.

In the present embodiment, the circuit board 10 is formed by cutting the mother board 300 on which the plurality of circuit boards 10 are formed. However, it is not limited thereto, and is possible to perform cream solder printing, mounting of the plurality of electronic components 5, and soldering in sequence on one circuit substrate 10, and subsequently to mount the circuit board 10 on the FPC as described above. It is also possible to interchange Step S5 and Step S6. In other words, a method of connecting the FPC 104 to the liquid crystal display panel 116 first, and subsequently mounting the circuit substrate 10 on the FPC 104 may be applied.

Subsequently, another example of the manufacturing method for the liquid crystal display device 100 will be described. FIG. 21 is a flowchart showing a modification of the assembling process of the liquid crystal display module 110 of the liquid crystal display device 100.

Since Step S11-S14 are the same as Step S1-S4 in the assembling process of the liquid crystal display module shown in FIG. 13 described above, the description will be omitted.

In Step S15, the FPC 104 is prepared, and the output terminal 14 of the FPC 104 is connected to the TFD substrate 111 of the liquid crystal display panel 116. Then the procedure goes to Step S16.

In Step S16, after having conducted an inspection whether or not the FPC 104 is correctly mounted on the liquid crystal display panel 116, the liquid crystal display module is assembled by using the circuit board 10 on which the plurality of electronic components 5 are mounted, the FPC 104 connected to the liquid crystal display panel 116, and a connecting structure such as rubber. More specifically, the aforementioned connecting structure is interposed between the circuit board 10 and the FPC 104. Accordingly, assembly of the module and mounting of the circuit board 10 on the FPC 104 can be performed simultaneously.

Even when the liquid crystal display module in the liquid crystal display device according to the present embodiment is manufactured in this manner, the circuit board 10 can be mounted on the FPC 104 with good working efficiency and high mounting density, and the FPC 104 can be assembled in a small space within the case 101.

Although the first liquid crystal display module 110 has been described in the manufacturing method for the liquid crystal display device described above, the same effects as the present embodiment are achieved when the second liquid crystal display module 130 is applied, as a matter of course.

Although the liquid crystal display device has been described as the electro-optical apparatus in the present embodiment, the present invention is not limited thereto, and it may be applied to various electro-optical apparatus such as an electro-luminescence device, more specifically, an organic electro-luminescence device, an inorganic electro-luminescence device, a compact TV-set employing a plasma display device, a FED (Field Emission Display) device, an SED (Surface Conduction Electron Emitter Display) device, an LED (light emitting diode) display device, an electrophoresis display device, a thin cathode ray tube, or a liquid crystal shutter, devices employing a digital micro-mirror device (DMD).

The electro-optical apparatus of the present invention is not limited to the examples shown in the drawings, and various modifications may be made thereto without departing from the scope of the present invention, as a matter of course. For example, although an active matrix type liquid crystal display module using the TFD (thin film diode) as an active element has been described as an example, the invention is not limited thereto, and may be applied to an active matrix type liquid crystal display module using an active element such as TFT (thin film transistor) and the like.

In addition, although the liquid crystal display device according to the above-described embodiment has a structure of, so called, COF (Chip On Film) type, a liquid crystal display device having a structure in which an IC chip is directly mounted on the terminal section of the liquid crystal panel is also applicable.

Subsequently, a mobile phone as electronic equipment with the liquid crystal display device 100 as the electro-optical apparatus of the present invention mounted thereon will be described. FIG. 22 shows an appearance of the mobile phone on which the liquid crystal display device 100 is mounted. A mobile phone 400 shown here includes a main body 401 and a display unit 402. Operating buttons 403 are arranged on the front surface of the main body 401. An antenna 404 is retractably mounted at one end of the display unit 402 provided thereon so as to be capable of opening and closing. A speaker is arranged inside a receiving unit 405, and a microphone is built in a talking unit 406.

The liquid crystal display device 100 includes, the first liquid crystal display module 110 positioned on the front side of the mobile phone 400, and the second liquid crystal display module 130 positioned on the back side of the mobile phone 400 as described above. The FPCs 104, 106 are both arranged on a display unit 302, so that the various displays relating to telephone communication are displayed by the liquid crystal display modules 110, 130. The FPCs 104, 106 having the circuit boards 10 on which the electronic components 5 are mounted functions as a part of a mobile control unit for controlling the entire mobile phone 400. The FPCs 104, 106, on which the circuit boards 10 formed of multi-layer plates are mounted, are arranged within the liquid crystal display device 100 in a small space, which contributes to downsizing of the mobile phone 400.

The mobile phone 400 may be configured without the second liquid crystal display module 130 on the back side.

In addition to the mobile phone 400 described above, electronic equipment to which the liquid crystal display module according to the present invention can be applied includes equipment using the liquid crystal display module, which corresponds to the electro-optical apparatus, such as a portable information equipment so-called a PDA (Personal Digital Assistants), a mobile personal computer, a personal computer, a digital still camera, a vehicle-mounted monitor, a digital video camera, a liquid crystal TV set, a view finder type or a monitor type video tape recorder, a car navigation system, a pager, an electronic data book, a calculator, a word processor, a workstation, a TV telephone set, a POS terminal, Therefore, the present invention can be applied to the structure of electric connection in the electronic equipment as a matter of course.

Modifications other than the embodiment described above according to the present invention are as follows.

Modification 1

The liquid crystal display module 110 of the liquid crystal display device 100, which corresponds to the electro-optical apparatus, may have a structure in which the liquid crystal display panel 116 and the FPC 104 connected thereto are fixed in the case 101 as a supporting member, and a space in which the backlight unit 120 can be assembled by inserting from behind is provided in the case 101. In this arrangement, assembly of the backlight unit 20 can be performed relatively easily. Also, even when there are problems in the backlight unit 120 in the course of the module assembling process, replacement can be performed relatively easily.

Modification 2

The number of circuit boards 10 is not limited to one. By mounting the circuit components which is subject to generation of noise due to the structure of the circuit on the additional circuit board and changing the place for installation, effect of the noise can be prevented.

Technological ideas grasped from the above-described embodiment and the modifications are as follows.

An electro-optical apparatus including an electro-optical panel having a display unit, a flexible printed circuit board having a output terminal to be electrically connected to at least one terminal section of the above described electro-optical panel, and a circuit board on which all or part of a plurality of electronic components for driving the electro-optical panel are mounted, wherein the circuit board is electrically connected to the flexible printed circuit board.

An electro-optical apparatus including an electro-optical panel having a display unit, a flexible printed circuit board connected to the electro-optical panel via a terminal, a light source for illuminating the electro-optical panel, and a circuit board on which all or part of a plurality of electronic components for driving the electro-optical panel and the light source are mounted, wherein the circuit board is electrically connected to the flexible printed circuit board.

What is claimed is:

1. An electro-optical apparatus comprising:
    an electro-optical panel having a display section;
    a flexible printed circuit board having a first terminal and a second terminal;
    the first terminal connected to the electro-optical panel and the second terminal connected to an external circuit;
    a rigid circuit board including a first surface with a first circuit pattern formed thereon, and a second surface with a second circuit pattern formed thereon, the second surface is opposite to the first surface;
    wherein the first surface is mounted to the flexible printed circuit board and electronic components are mounted to the second surface; and
    an entirety of the rigid circuit board is stacked on the flexible printed circuit board, and the rigid circuit board is electrically connected to the flexible printed circuit board and wherein the flexible printed circuit board has a first bent portion and a second bent portion, the rigid circuit board is arranged between the first bent portion and second bent portion, the first bent portion is arranged between the first terminal and the rigid circuit board, and the second bent portion is arranged between the second terminal and the rigid circuit board.

2. The electro-optical apparatus according to claim 1, wherein the rigid circuit board comprises one of a single-layer substrate or a multi-layer substrate.

3. The electro-optical apparatus according to claim 1, further comprising:
    a lighting unit including a light source and a guiding member for directing light from the light source toward the electro-optical panel;
    the electro-optical panel including a pair of substrates arranged so as to oppose each other via a sealing member;
    the electro-optical panel overlaps at least the guiding member in plan; and
    the flexible printed circuit board being electrically connected to one of the pair of substrates and being bent toward the light source unit.

4. The electro-optical apparatus according to claim 1, wherein the rigid circuit board is arranged inside the flexible printed circuit board.

5. The electro-optical apparatus according to claim 3, wherein the rigid circuit board is arranged so as to oppose one of: at least one of the substrates; and a side surface of the lighting unit.

6. The electro-optical apparatus according to claim 1, wherein the rigid circuit board is arranged outside the flexible printed circuit board.

7. Electronic equipment including the electro-optical apparatus according to claim 1 mounted therein.

8. The electro-optical apparatus of claim 1, wherein the rigid circuit board includes a plate.

* * * * *